US007250681B2

(12) United States Patent
Matsunaga

(10) Patent No.: US 7,250,681 B2
(45) Date of Patent: Jul. 31, 2007

(54) SEMICONDUCTOR DEVICE AND A METHOD OF MANUFACTURING THE SEMICONDUCTOR DEVICE

(75) Inventor: Noriaki Matsunaga, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/939,414

(22) Filed: Sep. 14, 2004

(65) Prior Publication Data
US 2006/0006547 A1  Jan. 12, 2006

(30) Foreign Application Priority Data
Jul. 7, 2004  (JP)  ............................ P2004-200713

(51) Int. Cl.
*H01L 23/48* (2006.01)
(52) U.S. Cl. ...................... 257/758; 257/773; 257/774; 257/775; 257/E21.577
(58) Field of Classification Search ................ 257/758, 257/773–775, E21.577; 438/118, 622, 618, 438/666
See application file for complete search history.

(56) References Cited

U.S. PATENT DOCUMENTS

| 4,617,193 | A | * | 10/1986 | Wu | ............................... | 438/631 |
| 5,063,175 | A | * | 11/1991 | Broadbent | .................. | 438/626 |
| 5,304,743 | A | * | 4/1994 | Sen et al. | .................... | 174/262 |
| 5,688,721 | A | * | 11/1997 | Johnson | ....................... | 438/109 |
| 5,893,727 | A | * | 4/1999 | Lau et al. | .................... | 438/125 |
| 6,162,650 | A | * | 12/2000 | Harvey et al. | ................. | 438/7 |
| 6,468,894 | B1 | * | 10/2002 | Yang et al. | .................. | 438/622 |
| 6,521,975 | B1 | * | 2/2003 | West et al. | .................. | 257/620 |
| 6,524,942 | B2 | | 2/2003 | Tsai et al. | | |
| 6,891,272 | B1 | * | 5/2005 | Fjelstad et al. | ............. | 257/774 |
| 6,908,841 | B2 | * | 6/2005 | Burrell et al. | .............. | 438/612 |
| 6,955,948 | B2 | * | 10/2005 | Asahi et al. | ................ | 438/125 |
| 7,042,094 | B2 | * | 5/2006 | Kothandaraman | .......... | 257/758 |
| 2003/0116852 | A1 | * | 6/2003 | Watanabe et al. | ........... | 257/758 |
| 2003/0127741 | A1 | * | 7/2003 | Farrar | ........................ | 257/758 |
| 2003/0209805 | A1 | * | 11/2003 | Choi et al. | .................. | 257/758 |
| 2003/0230809 | A1 | * | 12/2003 | Nakajima et al. | ........... | 257/758 |
| 2004/0150112 | A1 | * | 8/2004 | Oda | ............................ | 257/758 |
| 2004/0188826 | A1 | * | 9/2004 | Palanduz et al. | ........... | 257/700 |
| 2004/0195660 | A1 | * | 10/2004 | Hamada et al. | ............. | 257/642 |

FOREIGN PATENT DOCUMENTS

JP   2000-195866   7/2000

* cited by examiner

*Primary Examiner*—Eugene Lee
(74) *Attorney, Agent, or Firm*—Oblon, Spivak, McClelland, Maier & Neustadt, P.C.

(57) ABSTRACT

A semiconductor device includes first level wires; a low-dielectric constant film on the first level wires; first flat vias embedded in the low-dielectric constant film connected to the first level wires, each via having a first length in a longitudinal direction of the first level wires and a second length in a orthogonal direction to the first direction on a plane where the first level wires are disposed, aspect ratio of at least one of the first and second lengths to a height perpendicular to the plane is over 1; and second level wires disposed on the low-dielectric constant film connected to the first vias.

17 Claims, 32 Drawing Sheets

SEMICONDUCTOR DEVICE AND A METHOD OF MANUFACTURING THE SEMICONDUCTOR DEVICE

CROSS REFERENCE TO RELATED APPLICATIONS

This application is based upon and claims the benefit of priority from the prior Japanese Patent Applications No. P2004-200713, filed on Jul. 7, 2004; the entire contents of which are incorporated herein by reference.

BACKGROUND OF THE INVENTION

1. Field of the Invention

The present invention relates to a semiconductor device, and more specifically to a via structure suitable for arrangement in a layer under a bonding pad of a semiconductor device.

2. Description of the Related Art

With miniaturization and improvement in density of semiconductor devices, transmission delay, signal interference due to crosstalk between adjacent wires, and the like have been examined in wiring technology. In terms of wiring, copper (Cu), which has lower resistance than aluminum (Al), is used instead of Al, and techniques to keep interconnection resistance lower are adopted. In terms of interlayer insulating films, consideration has been made for a technique to reduce electric capacity between wires by using a low-dielectric constant film (low-k film) with a lower relative permittivity than that of a silicon oxidation ($SiO_2$) film.

To realize an insulating film with a small relative permittivity, for example, an insulating film with a relative permittivity k of not more than 3, the density of the insulating film needs to be reduced. However, the reduction of the density of the insulating film reduces the mechanical strength of the insulating film. Therefore, mechanical impact in bonding processes or packaging processes induce detachment or cracks of the insulating film. In some cases, membrane stresses of a plurality of insulating films in multilayer wiring cause cracks in the insulating films. When a strong mechanical impact is applied to a via located in a layer under a bonding pad section in the bonding or packaging process, the via absorbs the impact and is displaced. The low-dielectric constant film with low mechanical strength which is adjacent to the displaced via is then damaged, thus the reliability is lowered.

SUMMARY OF THE INVENTION

An aspect of the present invention inheres in a semiconductor device encompassing a plurality of first level wires; a low-dielectric constant film disposed on the first level wires; a plurality of first flat vias embedded in the low-dielectric constant film and connected to the first level wires, each via having a first length in a longitudinal direction of the first level wires and a second length in a orthogonal direction to the first direction on a plane where the first level wires are disposed, and aspect ratio of at least one of the first and second lengths to a height perpendicular to the plane is over 1; and a plurality of second level wires disposed on the low-dielectric constant film and connected to the first vias.

Another aspect of the present invention inheres in a method of manufacturing the semiconductor device encompassing disposing a low-dielectric constant film on a plurality of first level wires; embedding a plurality of first flat vias in the low-dielectric constant film so as to connect with the first level wires, each via having a first length in a longitudinal direction of the first level wires and a second length in a orthogonal direction to the first direction on a plane where the first level wires are disposed, and aspect ratio of at least one of the first and second lengths to a height perpendicular to the plane is over 1; and disposing a plurality of second level wires on the low-dielectric constant film so as to connect with the first vias.

BRIEF DESCRIPTION OF DRAWINGS

FIGS. 4 through 6A, and 6B are perspective views illustrating first via structures according to an embodiment of the present invention.

DETAILED DESCRIPTION OF THE INVENTION

Figure 1:
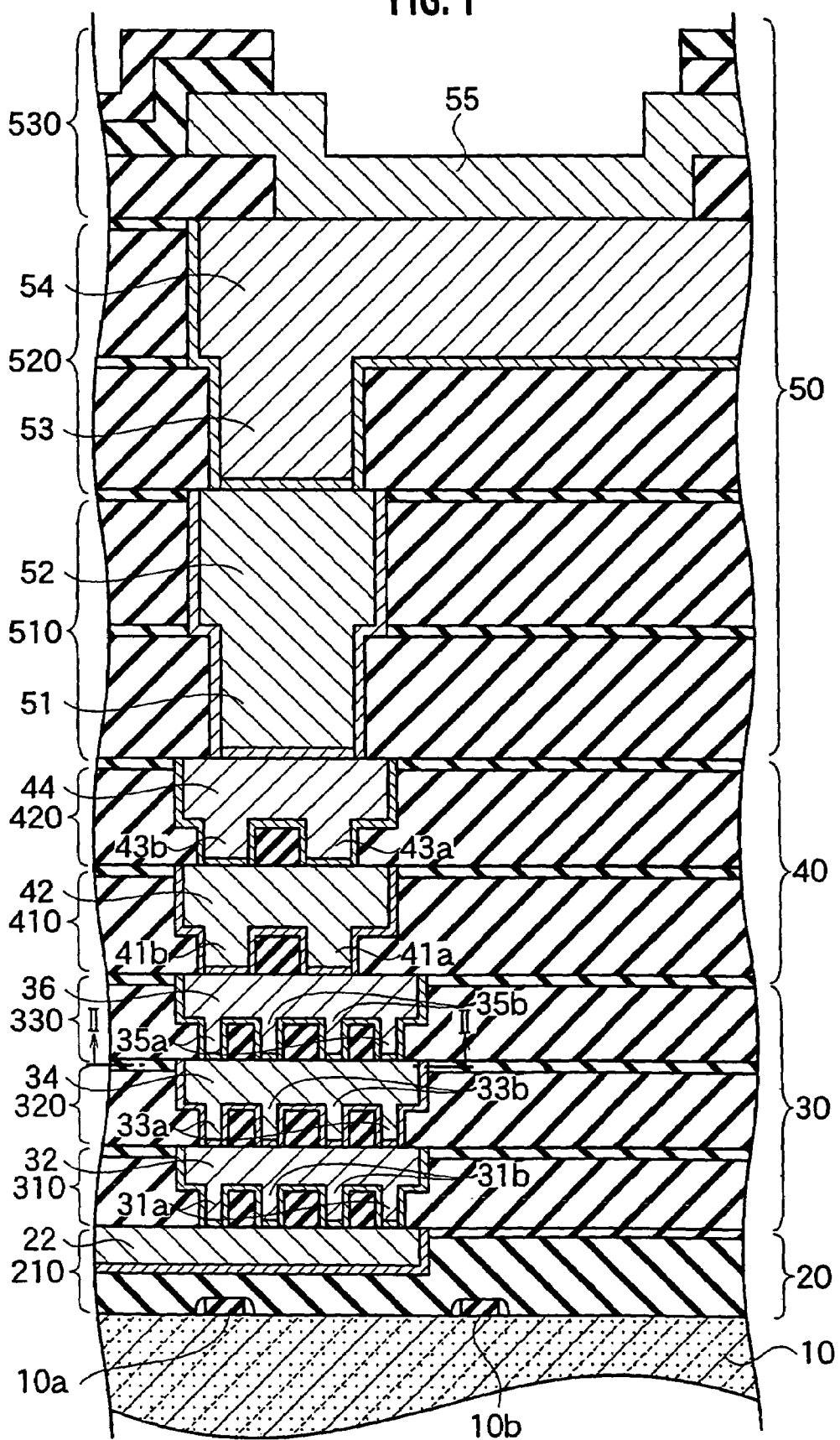
FIG. 1 is a cross-sectional view illustrating an example of a semiconductor device according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. However, it will be obvious to those skilled in the art that the present invention may be practiced without such specific details.

Semiconductor Device

Before describing via structures according to an embodiment of the present invention, an example of a semiconductor device applied for the via structures according to an embodiment will be shown.

The semiconductor device according to the embodiment, as shown in FIG. 1, includes a multilayer wiring structure in which, on a semiconductor chip 10, local wiring 20, intermediate wiring 30, semi-global wiring 40, and global wiring 50 are stacked.

In FIG. 1, the local wiring 20 indicates a metallic wiring layer connected to elements 10a and 10b of the semiconductor chip 10 through contact holes and the like not shown in FIG. 1. The intermediate wiring 30 indicates three metallic wiring layers laminated on the local wiring 20. The semi-global wiring 40 indicates two metallic wiring layers arranged on the intermediate wiring 30. The global wiring section 50 includes two metallic wiring layers arranged on the semi-global wiring 40 and a pad electrode 55 arranged in a topmost layer. The number of layers in each wiring of the semiconductor device shown in FIG. 1 can be properly modified according to the generation, type, and the like of the semiconductor device. In FIG. 1, the via structure according to the embodiment of the present invention is applied to each of the local wiring 20, the intermediate wiring 30, the semi-global wiring 40, and the global wiring 50, but where the via structure is used can be properly changed according to modes for carrying out the invention.

Figure 17:
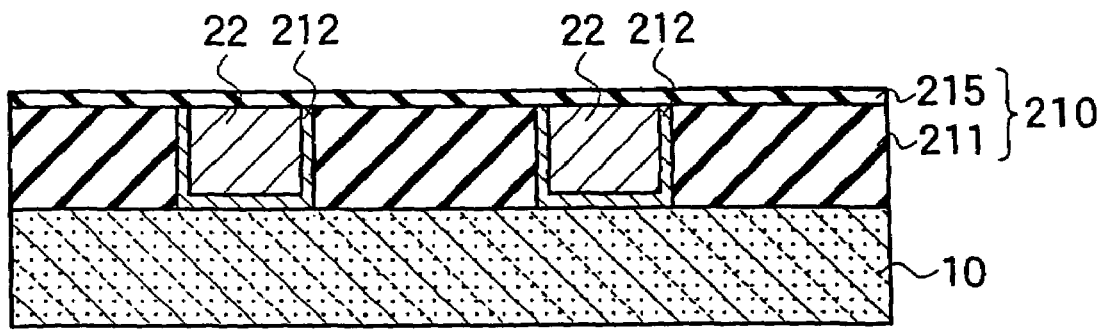

The local wiring 20, as the bottommost layer of the multilayer wiring, includes a first local wire 22 connected to the elements of the semiconductor chip 10. The first local wire 22 is embedded in a first interlayer insulating film 210 arranged on the semiconductor chip 10. The first interlayer film 210, as shown in FIG. 17 described later, may be composed of a plurality of films including a first insulating film 211 and a barrier film 215, which are not shown in FIG. 1. The first interlayer insulating film 210 can include, for example, a porous low-dielectric constant film (porous low-k film) with a relative permittivity of not more than 2.3.

The first local wire 22 is connected to a first intermediate wire 32 in an overlying layer through flat vias 31a and 31b. The first intermediate wire 32 is connected to a second intermediate wire 34 in an overlying layer through flat vias 33a and 33b. The second intermediate wire 34 is connected to a third intermediate wire 36 in an overlying layer through flat vias 35a and 35b.

A second interlayer insulating film 310 is arranged around the flat vias 31a and 31b on the first local wire 22 and around the first intermediate wire 32. A third interlayer insulating film 320 is arranged around the flat vias 33a and 33b on the first interlayer wire 32 and around the second intermediate wire 34. A fourth interlayer insulating film 330 is arranged around the flat vias 35a and 35b on the second intermediate wire 34 and around the third intermediate wire 36. Each of the second to fourth interlayer insulating films 310 to 330 can be composed of a plurality of films including barrier films, which are not shown in FIG. 1. It is agreeable that each of the second to fourth interlayer insulating films 310 to 330 contains, depending on the generation of the semiconductor device, a porous low-dielectric constant film with a relative permittivity of not more than 2.3.

The third intermediate wire 36 is connected to a first semi-global wire 42 in a layer in an overlying layer through flat vias 41a and 41b. The first semi-global wire 42 is connected to a second semi-global wire 44 in a layer in an overlying layer through flat vias 43a and 43b. Around the flat vias 41a and 41b on the third intermediate wire 36 and around the first semi-global wire 42 A fifth interlayer insulating film 410 is embedded. Around the flat vias 43a and 43b on the first semi-global wire 42 and around the second semi-global wire 44, a sixth interlayer insulating film 420 is embedded.

Each of the fifth and sixth interlayer insulating films 410 and 420 is composed of a plurality of films including barrier films, which are not shown in FIG. 1. Depending on the generation of the semiconductor device, it is desirable that each of the fifth and sixth interlayer insulating films 410 and 420, generally, contains a low-dielectric constant film with a relative permittivity smaller than that of a thermal silicon oxide film (Th—$SiO_2$ film), and desirably, contains a low-dielectric constant film with a relative permittivity of not more than 3.0.

The second semi-global wire 44 is connected to a first global wire 52 in an overlying layer through a flat via 51. The first global wire 52 is connected to a semi-global wire (connecting pad) 54 in an overlying layer through a flat via 53. On the connecting pad 54, the pad electrode 55 for connecting the semiconductor device to another semiconductor device or the like is arranged. Around the flat via 51 and the first global wire 52, a seventh interlayer insulating film 510 is arranged. Around the flat via 53a and the connecting pad 54, an eighth interlayer insulating film 520 is arranged. Around the pad electrode 55, a passivation film 530 composed of a plurality of films is arranged.

The seventh and eighth interlayer insulating films 510 and 520 can be formed of, for example, a plurality of films including an insulating film with a relative permittivity of not more than 4.0. For each of the seventh and eighth interlayer insulating films 510 and 520, in addition to the insulating film with a relative permittivity of not more than 4.0, a low-dielectric constant film with a relative permittivity of not more than 3.4 or a porous low-dielectric constant film can be used. For the passivation film 530, a $SiO_2$ film, a $Si_3N_4$ film, a SiON film, and the like can be used.

First Via Structure

A description will be given of a first via structure according to the embodiment taking a structure in the local wiring 20 of FIG. 1 as an example. The first via structure includes, as shown in FIG. 1, the first local wire 22 (first level wire), the second interlayer insulating film 310 arranged on the first local wire 22, the flat vias 31a and 31b (first flat vias) embedded in the second interlayer insulating film 310, and the first intermediate wire 32 (second level wire) connected to the flat vias 31a and 31b. The "flat via" means a "flat" via whose aspect ratios of lengths Lx and Ly to a height H of the via are not less than 1. The flat via is described later in detail. Hereinafter, in a flat via, the aspect ratio of the length Lx in the direction X to the height H is also referred to as an X-direction aspect ratio, and the aspect ratio of the length Ly in the direction Y to the height H is also referred to as a Y-direction aspect ratio.

The first local wire 22 is made of copper (Cu) and extends in a substantially perpendicular direction to a stacking direction of the semiconductor chip 10. For the second interlayer insulating film 310 arranged on the first local wire 22, a low-dielectric constant film with a relative permittivity of not more than 3.9 is suitable.

The material for the low-dielectric constant film can be classified into two types. One is a material using a $SiO_2$ film. For the material using a $SiO_2$ film, a material whose relative permittivity is controlled to be not more than 3.9 by reducing the density of the $SiO_2$ film is suitable. Examples of such a material are methyl silsesquioxane polymer (MSQ: $CH_3SiO_{1.5}$ (relative permittivity: 2.7–3.0)), hydrogen silsesquioxane polymer (HSQ:H—$SiO_{1.5}$ (relative permittivity: 3.5–3.8)), porous HSQ (H—$SiO_{1.5}$ (relative permittivity: 3.5–3.8), porous MSQ ($CH_3$—$SiO_{1.5}$ (relative permittivity: 2.0–2.5)), and organic silica ($CH_3$—$SiO_x$ (relative permittivity: 2.5–3.0)). The other type of material is a low-dielectric constant film using an organic film with low polarizability. Examples thereof are polytetrafluoroethylene (PTFE (relative permittivity: 2.1)), polyarylene ether (PAE (relative permittivity: 2.7–2.9), porous PAE (relative permittivity: 2.0–2.2), and benzocyclobutene (BCB (relative permittivity: 2.6–3.3). The material of the low-dielectric constant film used for the second interlayer insulating film 310 shown in FIG. 1 is a film with a relative permittivity of not more than 3.9, desirably, not more than 3.0, and more desirably, not more than 2.3.

Figure 2:
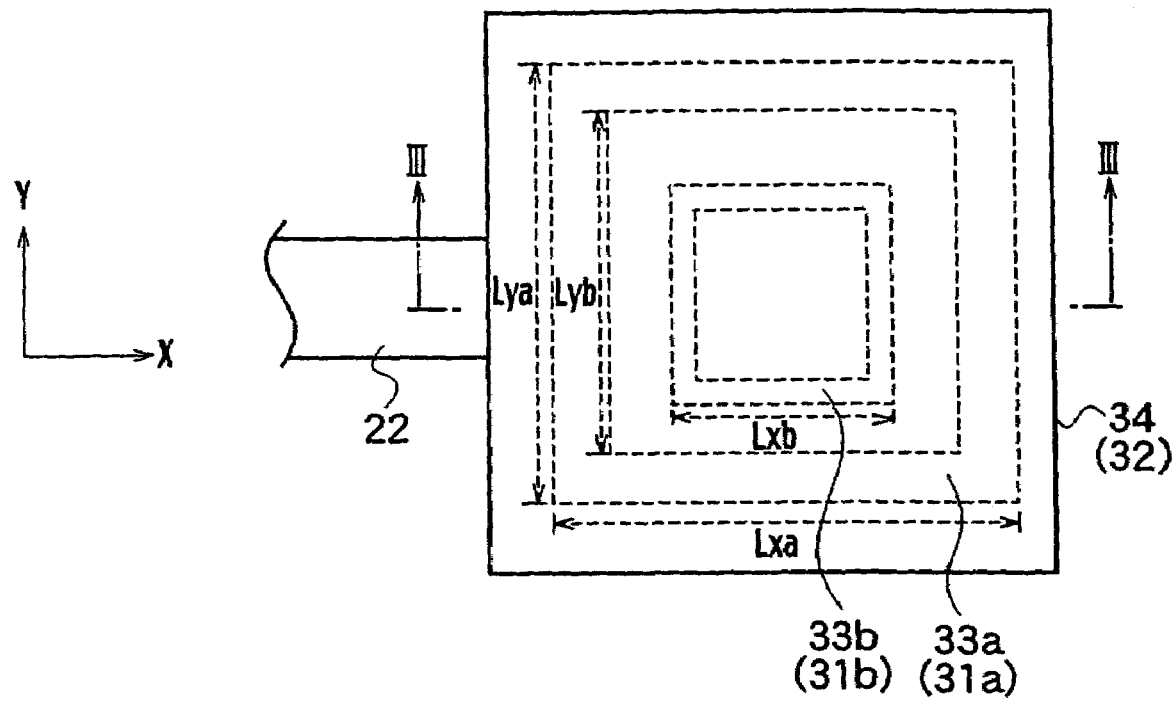
FIG. 2 is a cross-sectional view taken on line II—II in FIG. 1.
Figure 3:
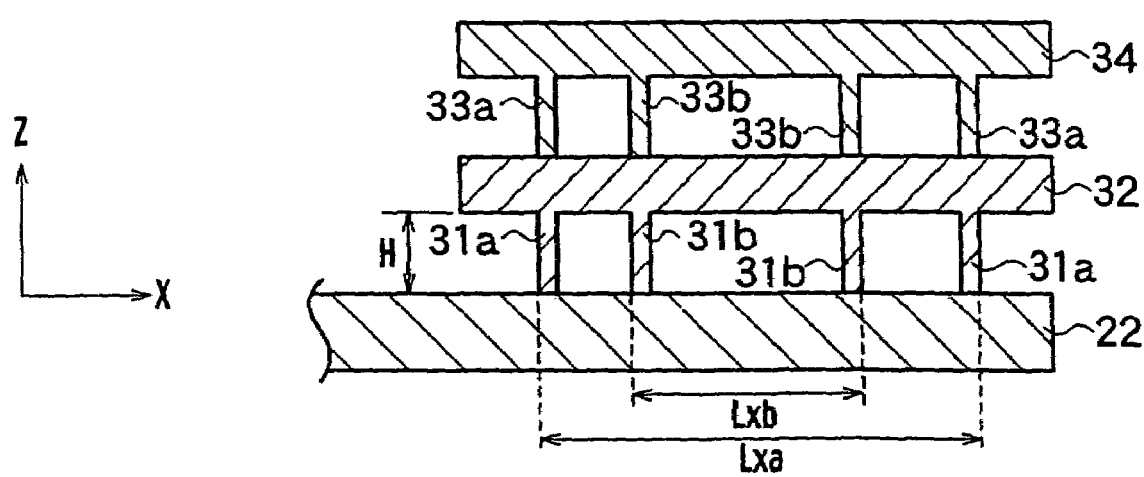
FIG. 3 is a cross-sectional view taken on line III—III in FIG. 2.

FIG. 2 is an example of a cross-sectional view taken on a line II—II in FIG. 1, and FIG. 3 is an example of a cross-sectional view taken on a line III—III. In the examples of FIGS. 2 and 3, the interlayer insulating films are not shown. The flat vias 33a and 33b, whose shapes viewed from the tops are quadrangular, are connected to the lower side of the second intermediate wire 34. The flat vias 31a and 31b, whose shapes viewed from the tops are quadrangular, are connected to the lower side of the first intermediate wire 32. The flat via 31a, as shown in FIG. 2, has a "length $Lx_a$" in the longitudinal direction (direction X) of the first local wire 22 and a "length $Ly_a$" in a direction Y orthogonal to the direction X in a plane where the first intermediate wire 32 is arranged, and, as shown in FIG. 3, has a "height H" in a direction Z perpendicular to the directions X and Y. The flat via 33b, as shown in FIG. 2, has a "length $Lx_b$" in the direction X and a "length $Ly_b$" in the direction Y, and, as shown in FIG. 3, has a "height H" in the direction Z.

In the examples shown in FIGS. 2 and 3, the flat via 31a is designed so that the aspect ratios of the length $Lx_a$ to the height H and of the length $Ly_a$ to the height H are not less than 1. The flat via 31b is designed so that the aspect ratios of the length $Lx_b$ to the height H and of the length $Ly_b$ to the height H are not less than 1. By setting the X-direction and Y-direction aspect ratios of the flat vias 31a and 31b to not less than 1, mechanical strength in the directions X and Y is increased. Since the flat vias 31a and 31b have the lengths $Lx_a$ and $Lx_b$ in the direction X and the lengths $Ly_a$ and $Ly_b$, stresses applied by chemical mechanical polishing (CMP) and the like can be distributed in two directions. Consequently, it is possible to suppress deformation of the flat via 31a and avoid damages of the low-dielectric constant film (first intermediate wire 32) arranged around the flat via 31a.

Figure 4:
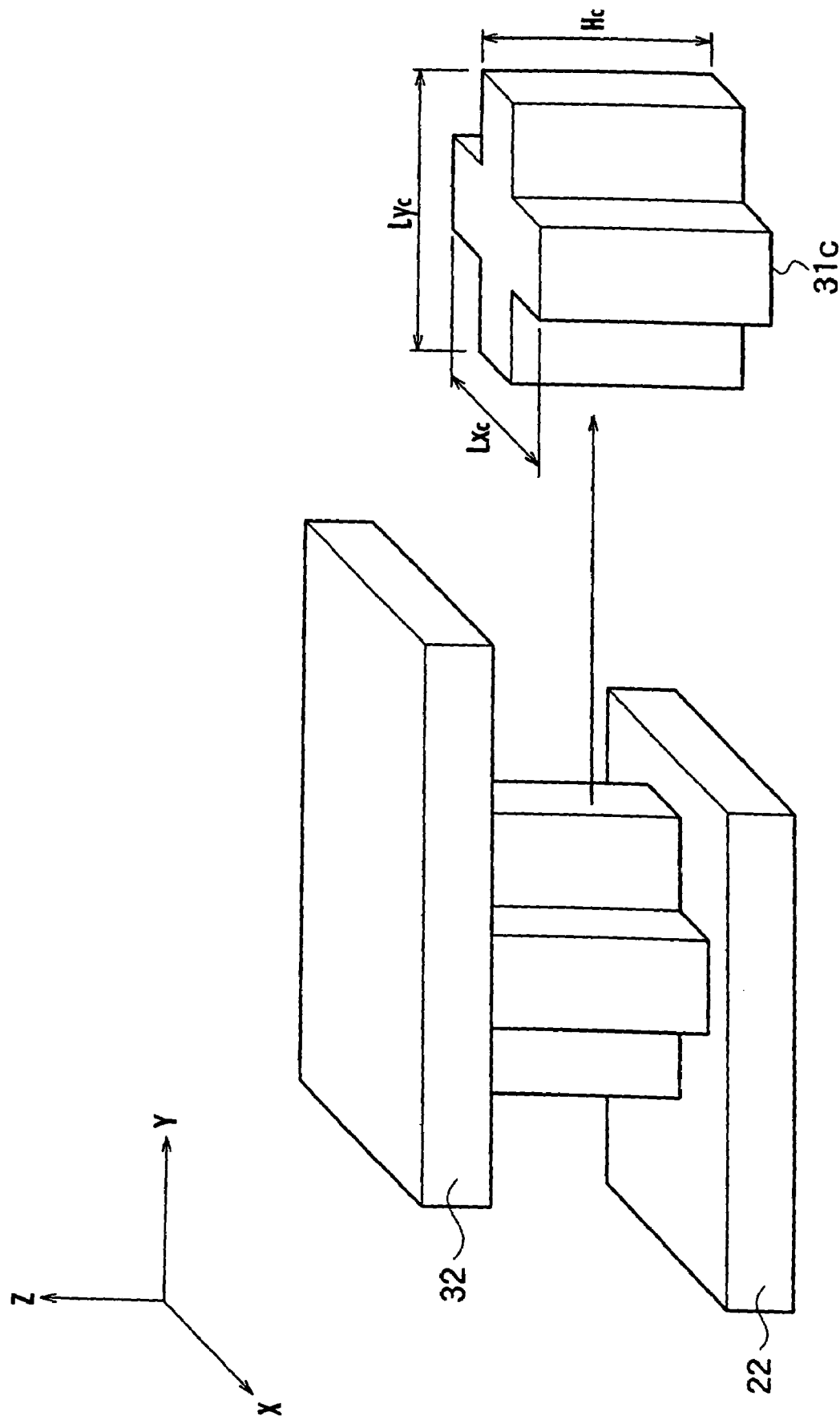

The shape of the flat via 31a is not limited to that in FIGS. 2 and 3 and can employ various shapes. For example, as shown in FIG. 4, it is possible to arrange a "cross-shaped" flat via 31c with lengths $Lx_c$ and $Ly_c$ and a height $H_c$ between the first local wire 22 and the first intermediate wire 32. The shape of the flat via 31c viewed from the side is rectangular, and the flat via 31c is formed so that the aspect ratio of the length $Lx_c$ to the height $H_c$ and of the length $Ly_c$ to the height $H_c$ are not less than 1. As shown in FIG. 4, arranging the flat via 31c which has the lengths $Lx_c$ and $Ly_c$ in the directions perpendicular to each other and expands in a cross shape can distribute stresses applied to the flat via 31c in two directions. Consequently, it is possible to provide a via which is less likely to be displaced in a plane substantially parallel to the longitudinal direction of the first local wire 22 and avoid damages of the interlayer insulating film therearound.

Figure 5A:
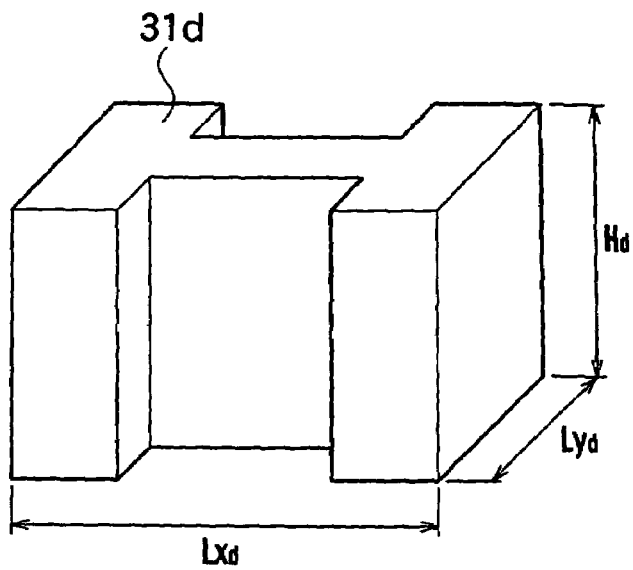
Figure 5B:
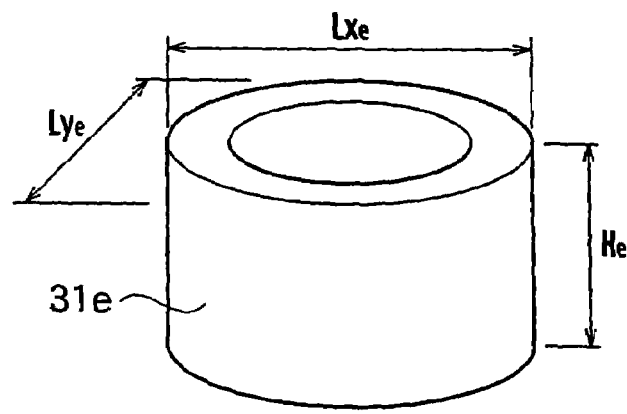
Figure 5C:
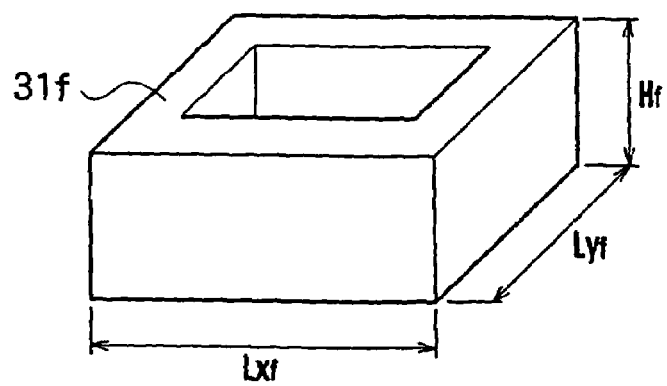

In addition, as the via with a shape expanding in the directions X and Y, for example, a flat via 31d whose shape viewed from the top is H-shaped as shown in FIG. 5A is suitable. The shape of the flat via 31d viewed from the side is rectangular, and the aspect ratios of the length $Lx_d$ to the height $H_d$ and of the length $Ly_d$ to the height $H_d$ are set to not less than 1. As shown in FIG. 5B, a flat via 31e whose shape viewed from the top is annular is also suitable. The shape of the flat via 31e viewed from the side is rectangular, and the aspect ratios of the length $Lx_e$ to the height $H_e$ and of the length $Ly_e$ to the height $H_e$ are not less than 1. As shown in FIG. 5C, a flat via 31f whose shape viewed from the top view is rectangular and the like are also suitable. The shape of the flat via 31f viewed from the side is rectangular, and the aspect ratios of the length $Lx_f$ to the height $H_f$ and of the length $Ly_f$ to the height $H_f$ are set to not less than 1.

Figure 6A:
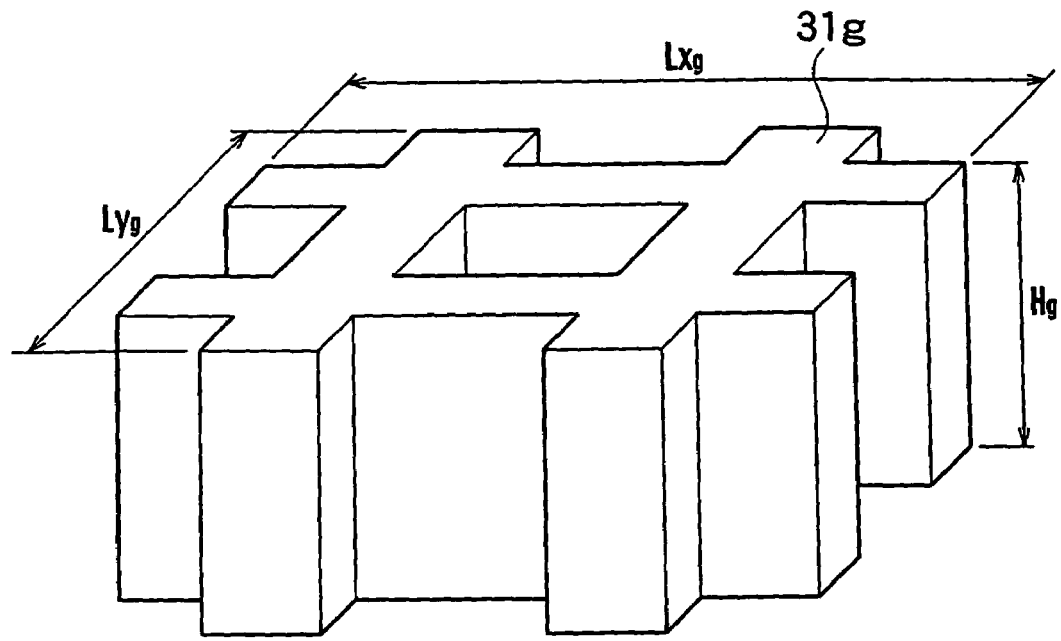
Figure 6B:
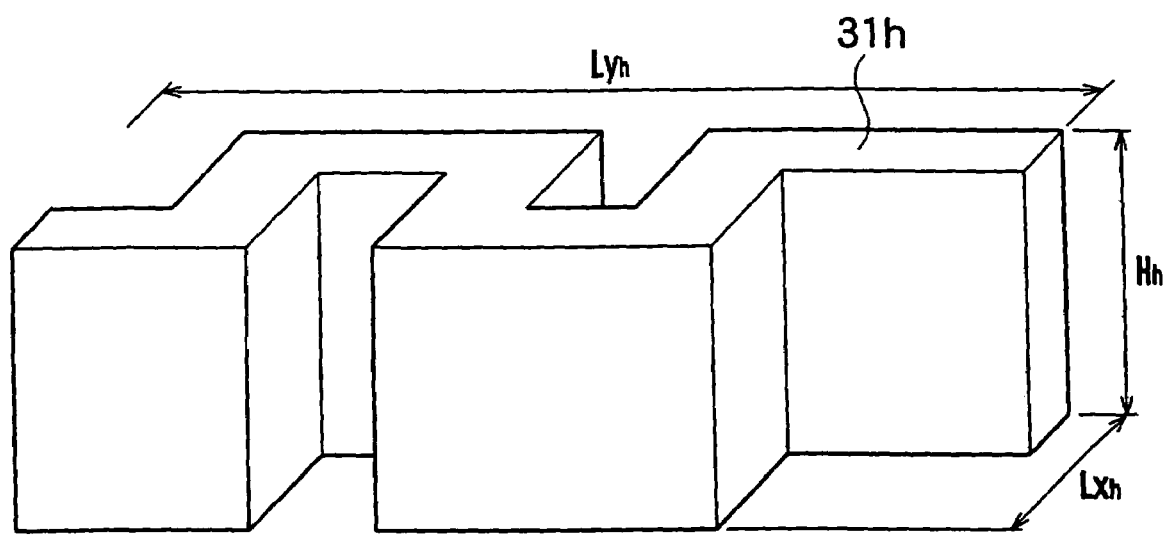

As shown in FIG. 6A, a flat via 31g is also suitable, whose shape viewed from the top is shaped in a character "#" by a combination of four flat vias 31c shown in FIG. 4. Moreover, a flat via 31h, whose shape viewed from the top is meander-shaped as shown in FIG. 6B, is suitable. The shape of the flat via 31g viewed from the side is rectangular, and the aspect ratios of the length $Lx_g$ to the height $H_g$ and of the length $Ly_g$ to the height $H_g$ are set to not less than 1. The side view of the flat via 31h is also rectangular, and the aspect ratios of the length $Lx_h$ to the height $H_h$ and of the length $Ly_h$ to the height $H_h$ are set to not less than 1.

As described above, with the first via structure, as vias for connecting wires, the flat vias 31a to 31h, in each of which the lengths Lx and Ly measured in two directions orthogonal to each other in a plane where the wire extends are longer than the height H, are arranged. Stresses caused in the CMP or bonding process are therefore distributed in the two directions orthogonal to each other in the flat vias 31a to 31h, which allows the flat vias 31a to 31h to be less likely to be deformed. Consequently, it is possible to avoid the damages of interlayer insulating films, in particular, low-dielectric constant films, arranged around the flat vias 31a to 31h.

Second Via Structure

A description will be given of a second via structure according to an embodiment taking a flat via 53 arranged directly under the connecting pad 54 of FIG. 1 as an example. The second structure, as shown in FIG. 1, includes the first global wire 52 (first level wire), the eighth interlayer insulating film 520 arranged on the first global wire 52, the flat via 53 (first flat via) embedded in the eighth interlayer insulating film 520, and the connecting pad 54 (second level wire) connected to flat via 53. The pad electrode 55 is arranged directly above the connecting pad 54.

Figure 7:
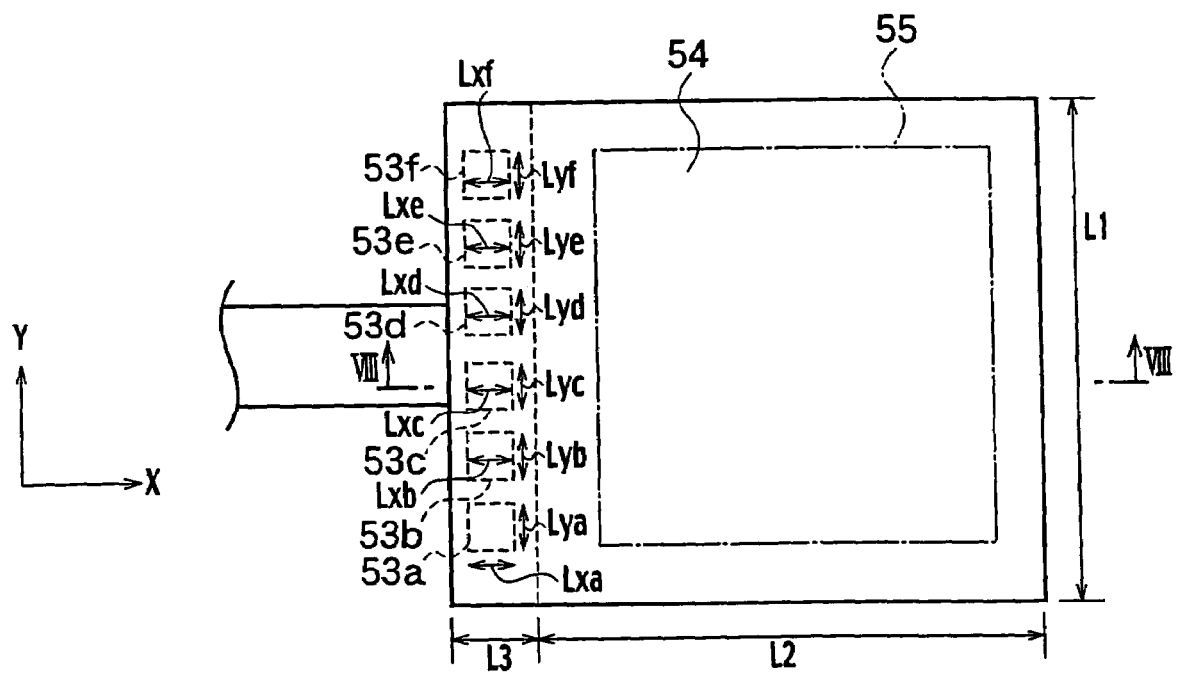
FIG. 7 is a perspective view illustrating a second via structure according to an embodiment of the present invention.
Figure 8:
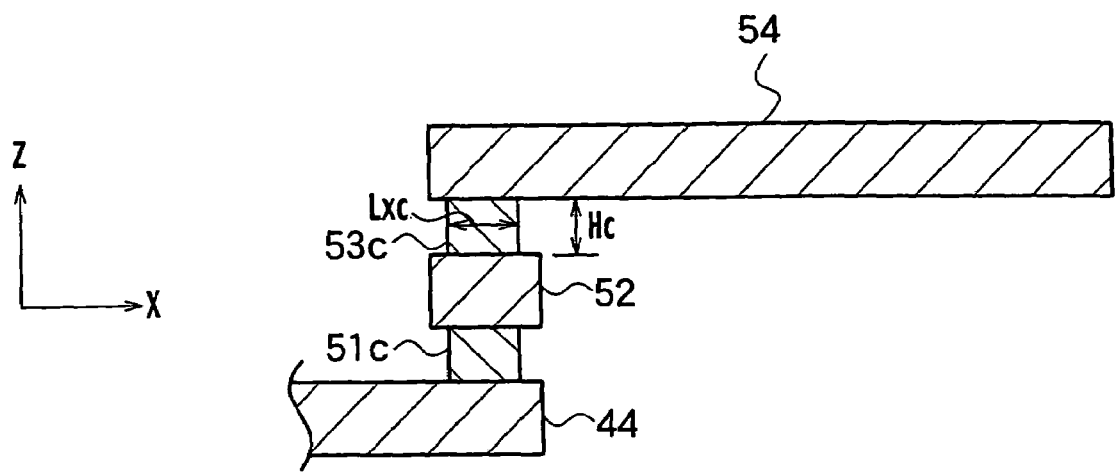
FIG. 8 is a cross-sectional view taken on line VIII—VIII in FIG. 7.

FIG. 7 shows an example of a schematic plan view of the connecting pad 54 from the top, and FIG. 8 shows an example of a cross-sectional view taken on a line VIII—VIII in FIG. 7. In FIGS. 7 and 8, the interlayer insulating films are not shown. As shown in FIG. 7, the pad electrode 55 is arranged in an area surrounded by a dotted line in the connecting pad 54, whose shape viewed from the top is quadrangular. A plurality of flat vias 53$a$ to 53$f$ for connection to an underlying wire are arranged in an area of a length L1×a length L3 in the lower surface of the connecting pad 54. Desirably, the lengths L1 to L3 of the connecting pad 54 are about 50 to 100 μm, about 50 to 100 μm, and about 1 to 30 μm, respectively.

As shown in FIG. 8, the first global wire 52 is connected to the lower surface of the connecting pad 54 through the flat via 53$c$. The lower surface of the first global wire 52 is connected to the second semi-global wire 44 through the flat via 51$c$. Taking the flat via 53$c$ as an example, in the flat via 53$c$, as shown in FIG. 7, a length "$Lx_c$" is a length measured in a direction X parallel to the longitudinal direction of the first local wire 22, and a length "$Ly_c$" is a length measured in a direction Y (second direction) orthogonal to the direction X in a same plane. As shown in FIG. 8, a height "$H_c$" is a height measured in a direction Z perpendicular to the directions X and Y. The flat via 53$c$ is designed so that aspect ratios of the length $Lx_c$ to the height $H_c$ and of the length $Ly_c$ to the height $H_c$ are not less than 1.

Figure 9:
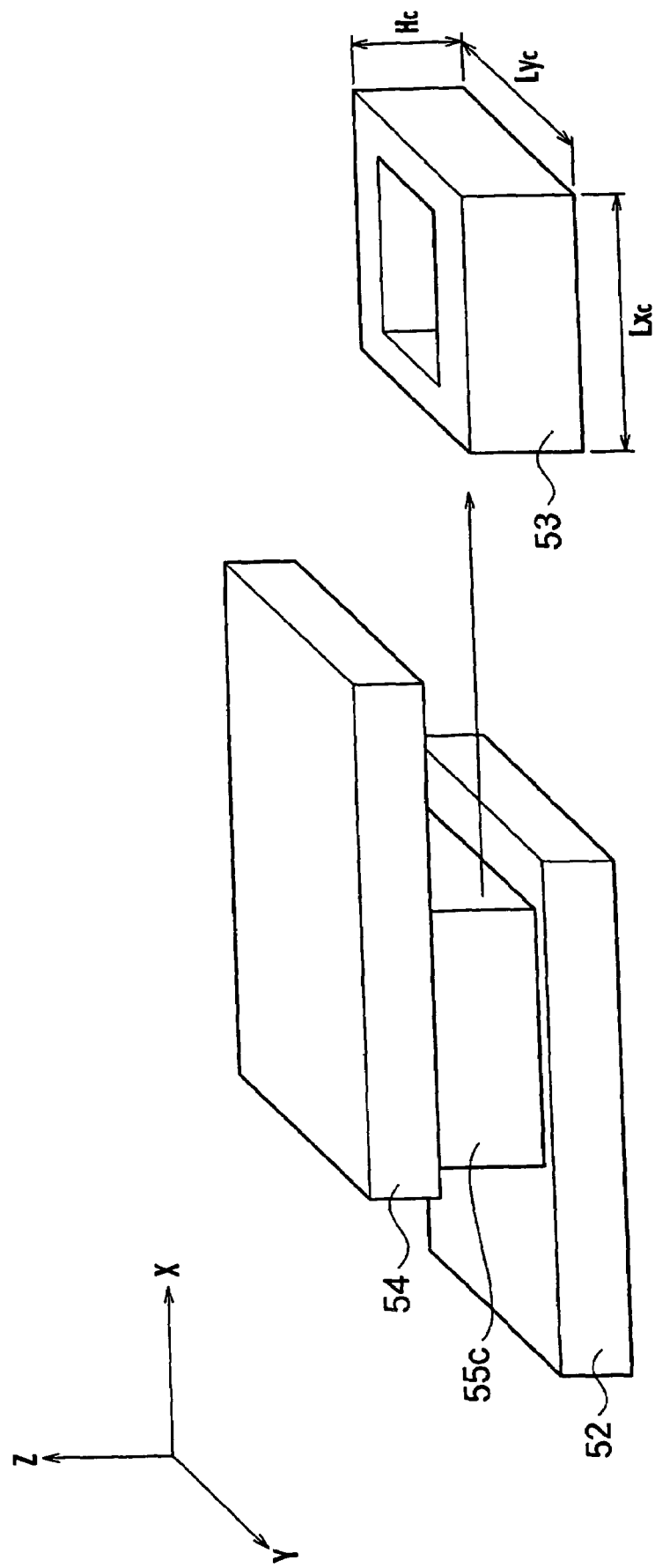
FIG. 9 is a perspective view illustrating arrangement relationship between wirings and vias of the second via structure according to an embodiment of the present invention.

FIG. 9 is a schematic view explaining the positional relationship among the first global wire 52, the flat via 53$c$ and the connecting pad 54. The flat via 53$c$ is arranged between the first global wire 52 and the connecting pad 54 so as to have the lengths $Lx_c$ and $Ly_c$ and the height $H_c$. The shape of the flat via 43$c$ viewed from the side is rectangular. The flat via 53$c$ is designed so that the aspect ratios of the length $Lx_c$ to the height $H_c$ and of the length $Ly_c$ to the height $H_c$ are not less than 1. In the flat via 53$c$ shown in FIG. 9, since the lengths $Lx_c$ and $Ly_c$ measured in two directions of the directions X and Y are longer than the height $H_c$, stresses applied to the flat via 53$c$ can be distributed in two directions. Consequently, it is possible to provide a via structure suitable for arrangement directly under the pad electrode 55 which is particularly subjected to strong stresses in the bonding process.

Figure 10A:
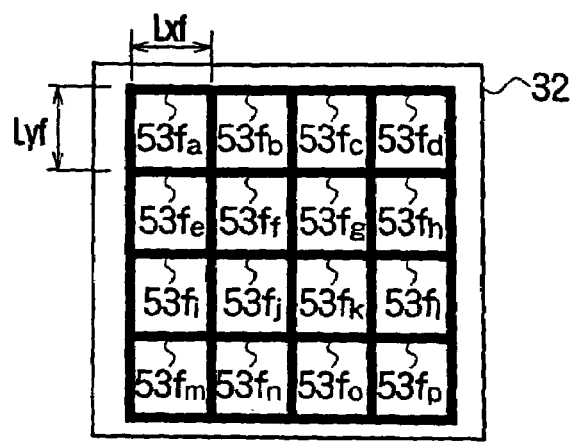
FIGS. 10A, 10B, 10C, and 10D are plane views illustrating via arrangement examples of the semiconductor device according to an embodiment of the present invention.
Figure 10B:
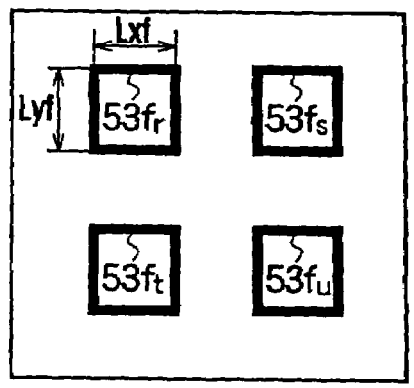
Figure 10C:
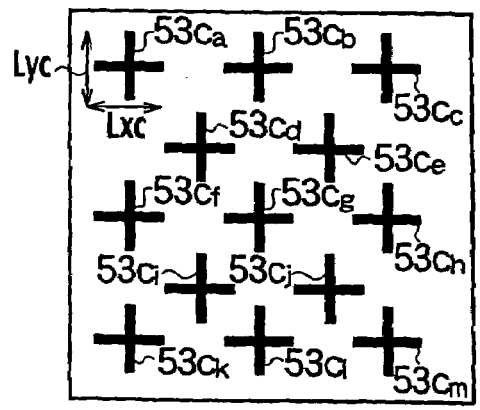
Figure 10D:
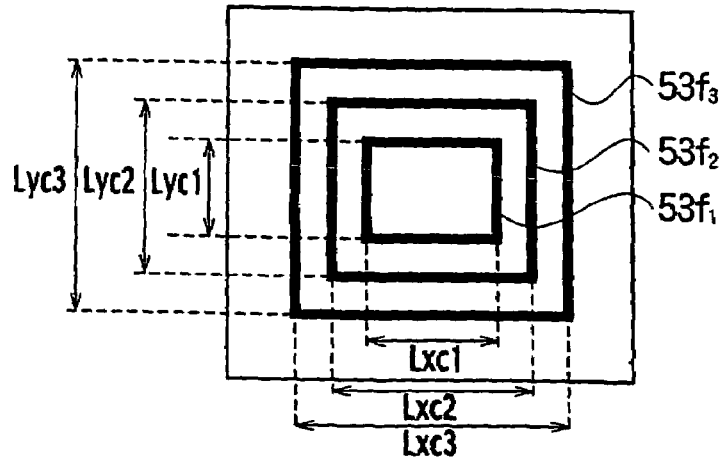

FIGS. 10A to 10D show examples of the positional relationship between the connecting pad 54 and the flat via 53 when viewed from the top of the connecting pad 54 shown in FIG. 1. In FIGS. 10A to 10D, the shapes of the flat vias 53$c$, 53$f$ . . . , which are not visible from the top of the connecting pad 54, are indicated by real lines. As shown in FIG. 10A, a plurality of flat vias 53$f_a$, 53$f_b$ . . . , and 53$f_p$ with lengths $Lx_f$ and $Ly_f$ and a height $H_f$ are laid closely under the entire connecting pad 54 to form a "mesh structure" of the via layer (hereinafter, the mesh shape shown in FIG. 10A is referred to as the "mesh structure"). As shown in FIG. 10B, it is possible to arrange a plurality of flat vias 53$f_r$, 53$f_s$, 53$f_t$, and 53$f_n$ separately from each other. As shown in FIG. 10C, it is possible to arrange cross-shaped flat vias 53$c_a$, 53$c_b$ . . . , and 53$f_m$ with the lengths $Lx_c$ and $Ly_c$ and the height $H_c$ separately from each other under the entire connecting pad 54. As shown in FIG. 10D, it is possible to arrange a plurality of flat vias 53$f_{f1}$, 53$f_{f2}$, and 53$f_{f3}$, which have different lengths $Lx_{c1}$, $Lx_{c2}$, and $Lx_{c3}$ in the direction X and different lengths $Ly_{c1}$, $Ly_{c2}$, and $Ly_{c3}$ in the direction Y, under the connecting pad 54.

With the structures shown in FIGS. 10A to 10D, as the vias for connection to the connecting pad 54, the flat vias 53$f_a$ . . . , each of which has the lengths Lx and Ly, extends in two directions, and has X-direction and Y-direction aspect ratios of not less than 1, are arranged. Therefore, stresses generated in the bonding process or the like can be distributed in two directions, and the vias can be prevented from being deformed. The structures shown in FIGS. 10A to 10D are agreeable, in particular, for vias used in the vicinity of the pad electrode 55, which is subjected to strong stresses in the bonding process. The cross-sectional area of the connecting pad 54 is larger than the cross-sectional areas of wires in lower layers. Accordingly, the flat vias 53$c_a$ . . . are easily arranged under the connecting pad 54 compared to the case of employing the flat vias 53$c_a$ . . . in wires in the lower layers.

First Method of Manufacturing the Semiconductor Device

Next, a description will be given of a first method of manufacturing the semiconductor device according to the embodiment with reference to FIGS. 11 to 27. The method of manufacturing the semiconductor device described below is just an example, and it is obvious that various manufacturing methods, other than this, can be implemented, including modified examples of this. In FIGS. 11 to 27, as an example, the method of manufacturing the aforementioned first via structure using a cross section different from the cross section shown in FIG. 1.

Figure 11:
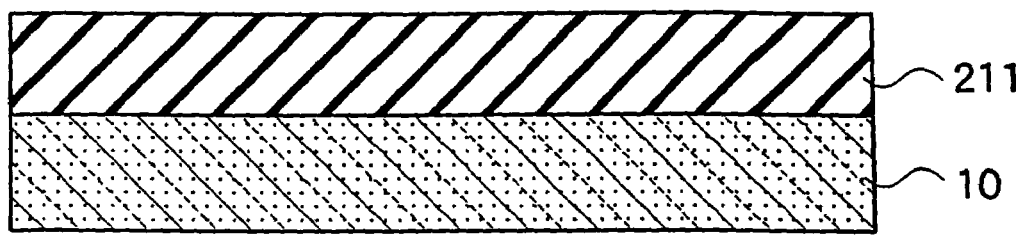
FIGS. 11 through 26 are cross-sectional views illustrating a first method of the semiconductor device according to an embodiment of the present invention.
Figure 12:
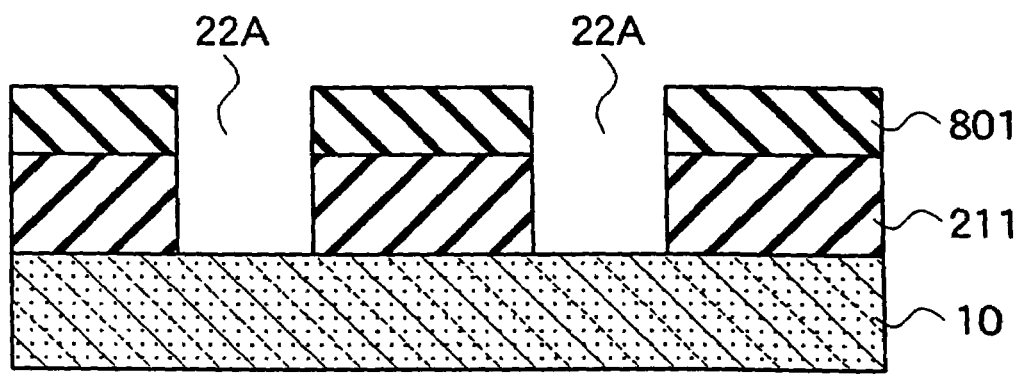
Figure 13:
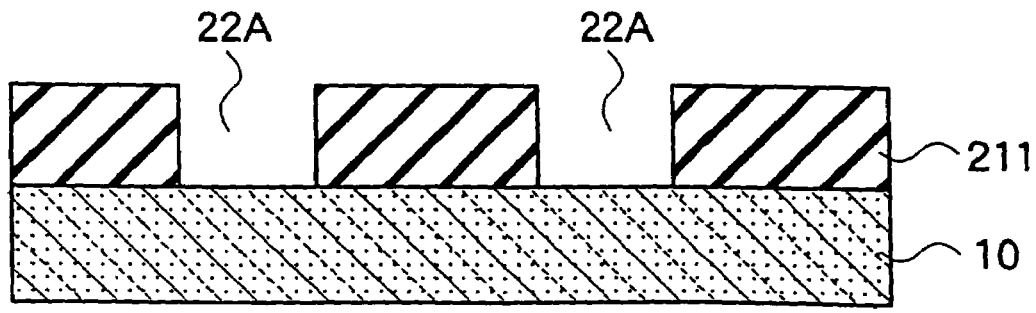

(a) As shown in FIG. 11, the first insulating film 211 is formed by chemical vapor deposition (CVD), spin-coating, or the like on the semiconductor chip (semiconductor substrate) 10 where elements (not shown) have been formed. As the first insulating film 211, a porous low-dielectric constant film with a relative permittivity of not more than 2.3 may be applied. Instead of the porous low-dielectric constant film, a $SiO_2$ film, a phosphorous doped oxide (PSG: phosphosilicate glass) film, a boron and phosphorous doped oxide (BPSG: borophosphosilicate glass) film, a $Si_3N_4$ film, a polyimide film, and the like can be applied. As shown in FIG. 12, a photoresist film 801 is spin-coated on the surface of the first insulating film 211 and then delineated by use of a photolithography process. Part of the first insulating film 211 is selectively stripped by reactive ion etching (RIE) or the like using the patterned photoresist film 801 as an etching mask to form trenches 22A. Subsequently, as shown in FIG. 13, the photoresist film 801 is stripped.

Figure 14:
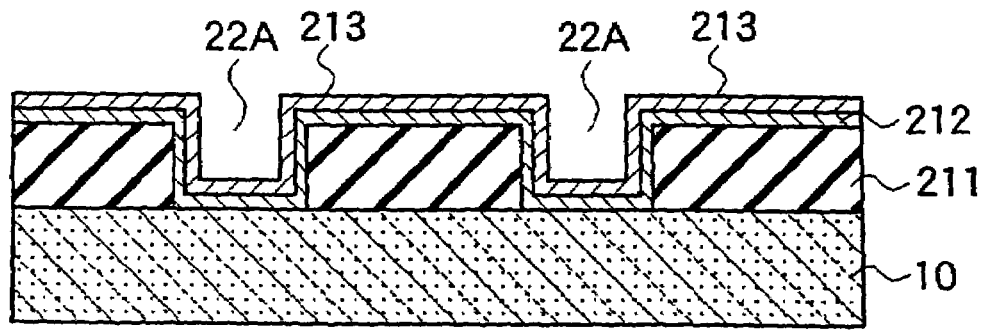
Figure 15:
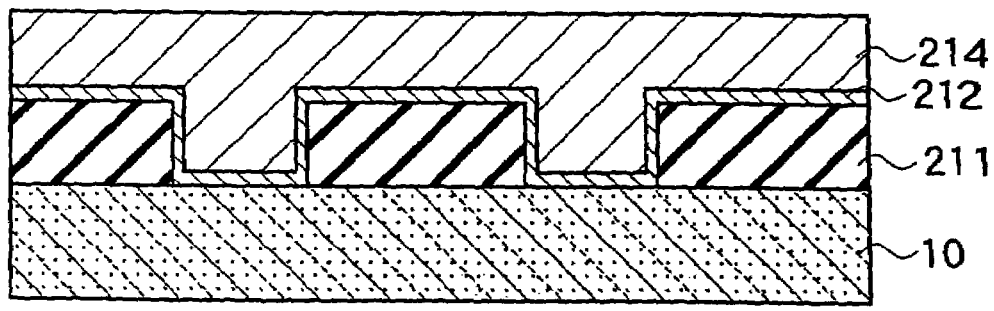
Figure 16:
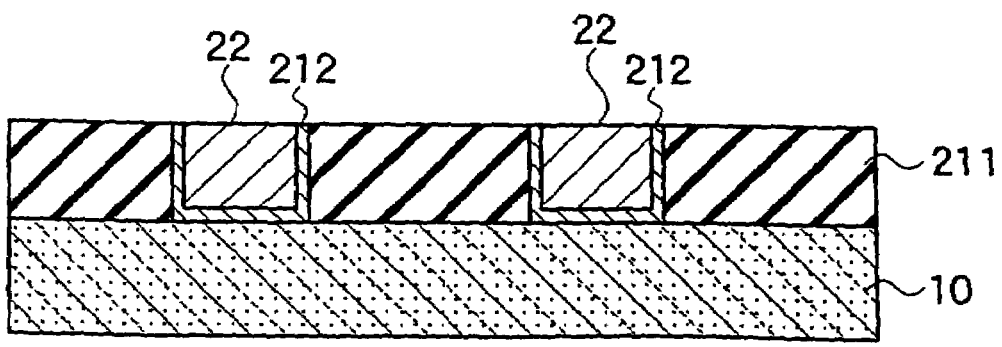

(b) As shown in FIG. 14, barrier metal 212 is provided by CVD or the like on the surface of the trenches 22A and the first insulating film 211. For the barrier metal 212, titan (Ti), tantalum (Ta), tungsten (W), titanium nitride (TiN), tantalum nitride (TaN), tungsten nitride (WN), and laminated films using these materials are suitable for use. On the surface of the barrier metal 212, a Cu seed film 213 is formed by sputtering or the like. As shown in FIG. 15, a Cu layer 214 is deposited on the Cu seed film 213 by plating. As shown in FIG. 16, the Cu layer is polished by CMP until the surface of the first insulating film 211 is exposed, and the surface of the first insulating film 211 and the Cu layer 214 is flattened, thus forming the first local wires 22.

Figure 18:
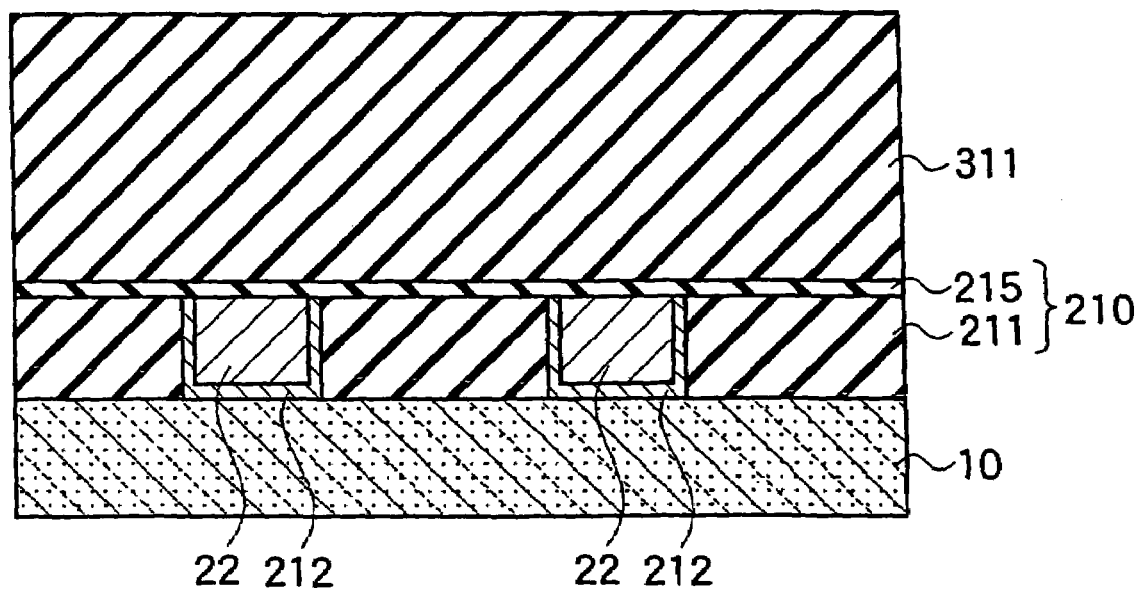

(c) As shown in FIG. 17, on the surfaces of the first local wires 22 and the first insulating film 211, the barrier film 215 is formed by CVD or the like. For the material of the barrier film 215, silicon carbide (SiC), carbon-doped silicon nitride (SiCN), SiN, carbon-doped silicon oxide (SiOC), or the like is desirable. In this manner, the first insulating film 210 composed of the first insulating film 211 and the barrier film 215 is formed. Subsequently, as shown in FIG. 18, the second insulating film 311 is formed on the first interlayer insulating film 210 by CVD or the like. For the second insulating film, a porous low-dielectric constant film with a relative permittivity of not more than 2.3 or a low-dielectric constant film with a relative permittivity of not more than 3.4, or desirably, not more than 3.0 is suitable.

Figure 19:
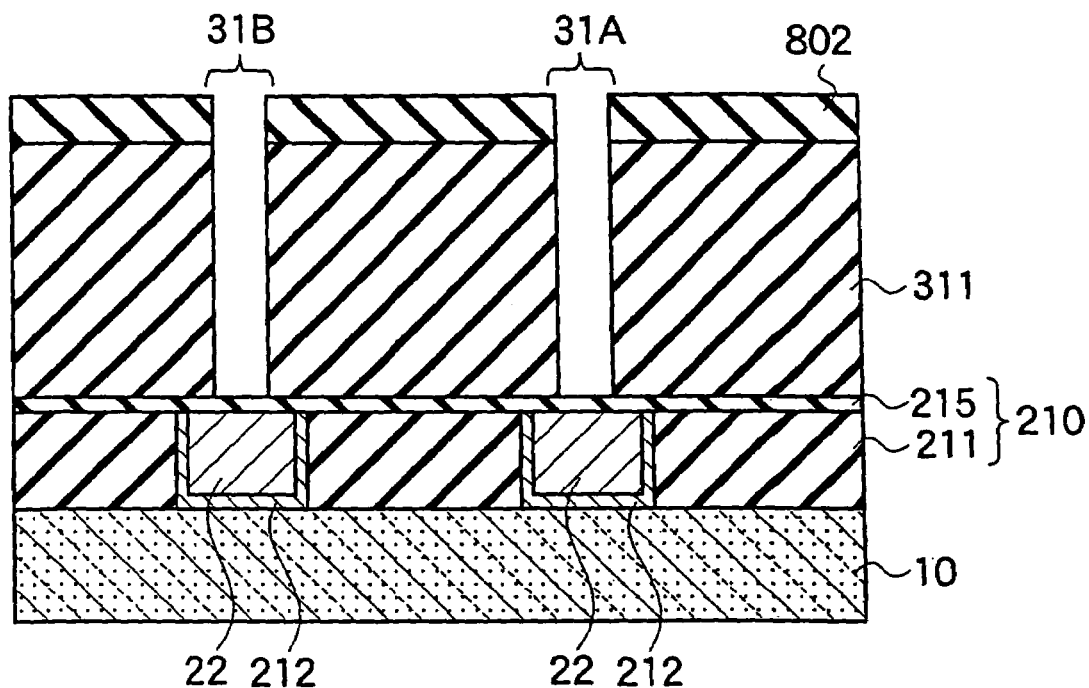
Figure 20:
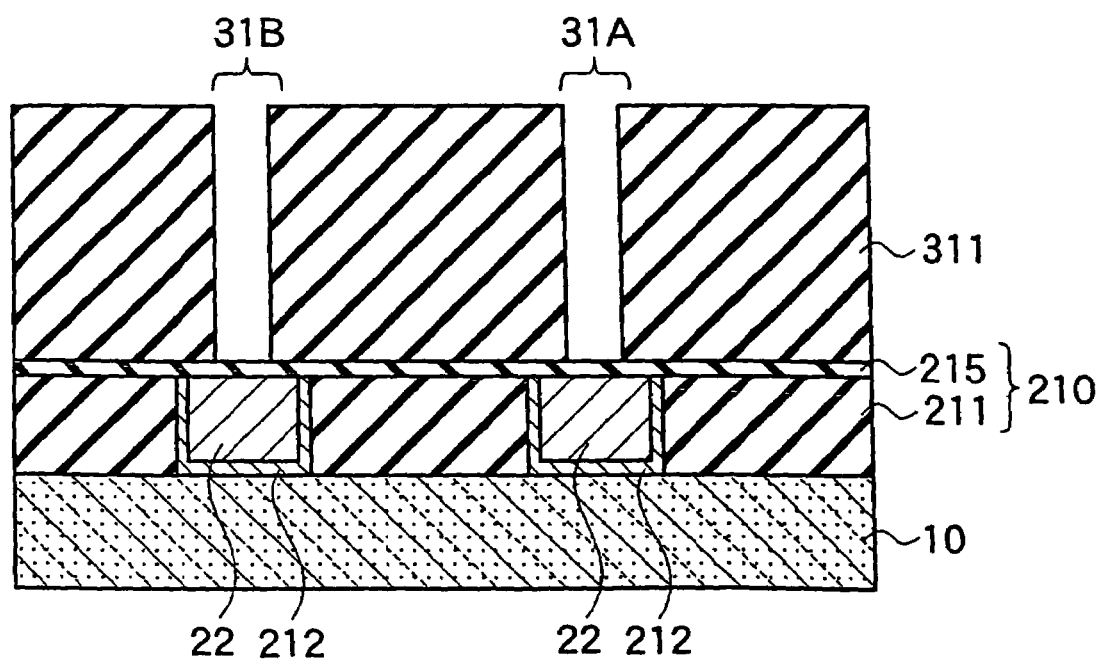
Figure 21:
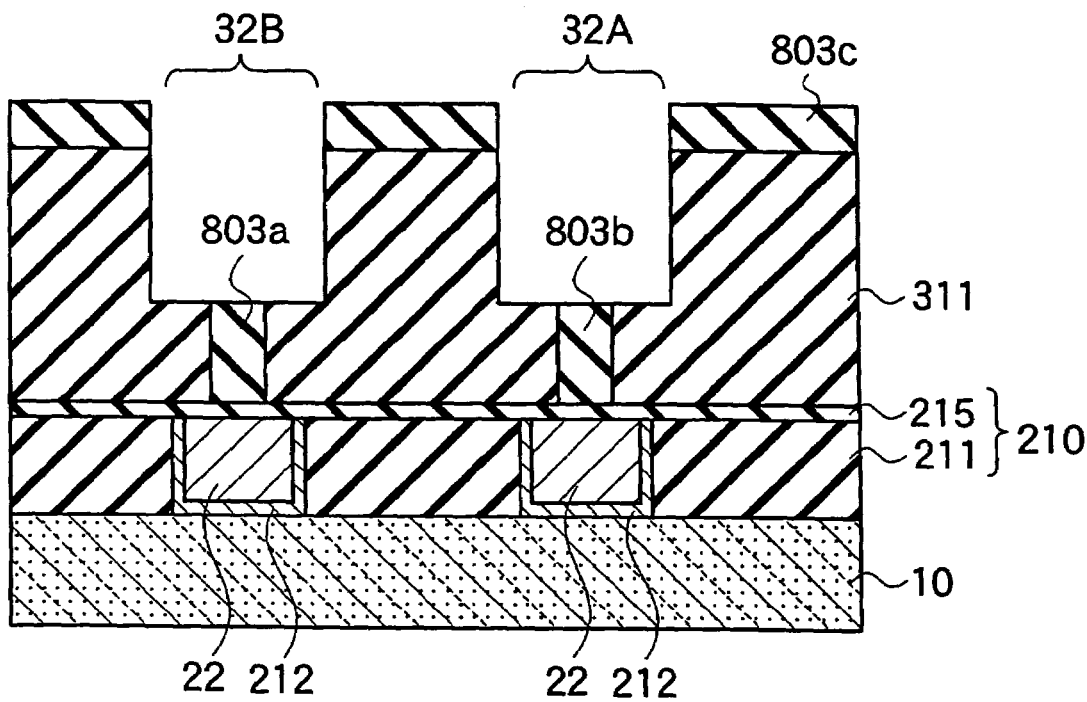
Figure 22:
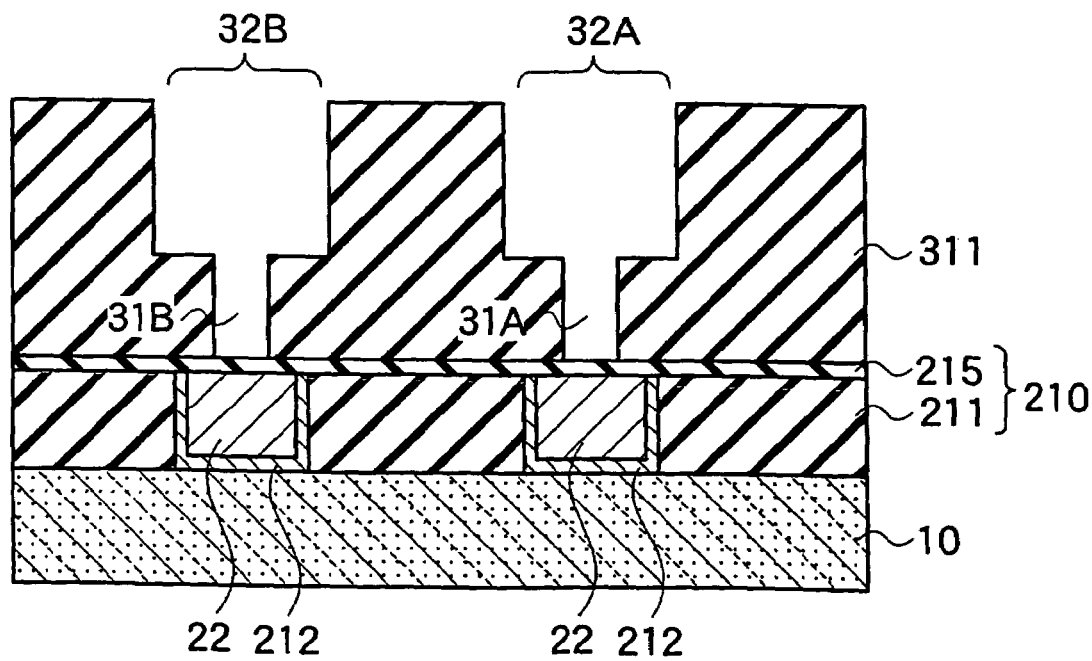

(d) As shown in FIG. 19, a photoresist film 802 is applied on the second insulating film 311 and then delineated by use of a photolithography process. Via holes 31A and 31B are formed by RIE using the delineated photoresist film 802 as an etching film. Subsequently, as shown in FIG. 20, the photoresist film 802 is stripped. Subsequently, photoresist is applied on the surface of the second insulating film 311 and delineated into photoresist films 803a, 803b, and 803c by use of a photolithography process. Trenches 32A and 32B shown in FIG. 21 are then formed by use of the photoresist films 803a to 803c as etching masks. Thereafter, the photoresist films 803a to 803c remaining in the via holes 31A and 31B and on the surface of the second insulating film 311 are stripped. Therefore, as shown in FIG. 22, the via hole 31A, the trench 32A connected to the via hole 31A, the via hole 31B, and the trench 32B connected to the via hole 31B are formed in the second insulating film 311.

Figure 23:
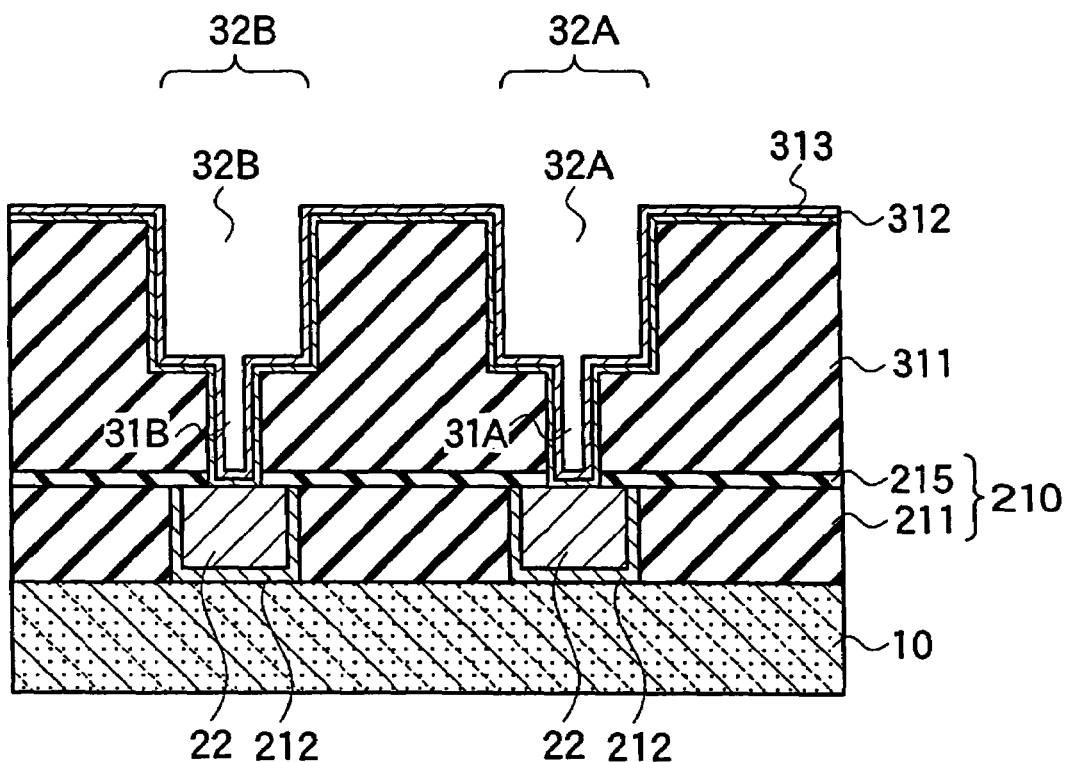
Figure 24:
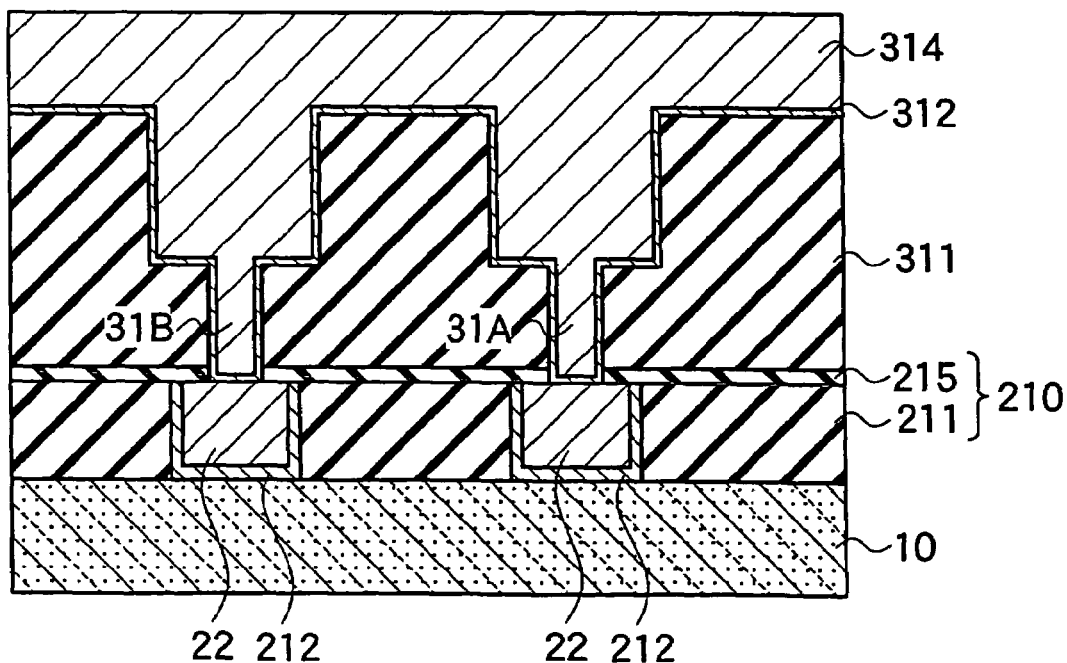
Figure 25:
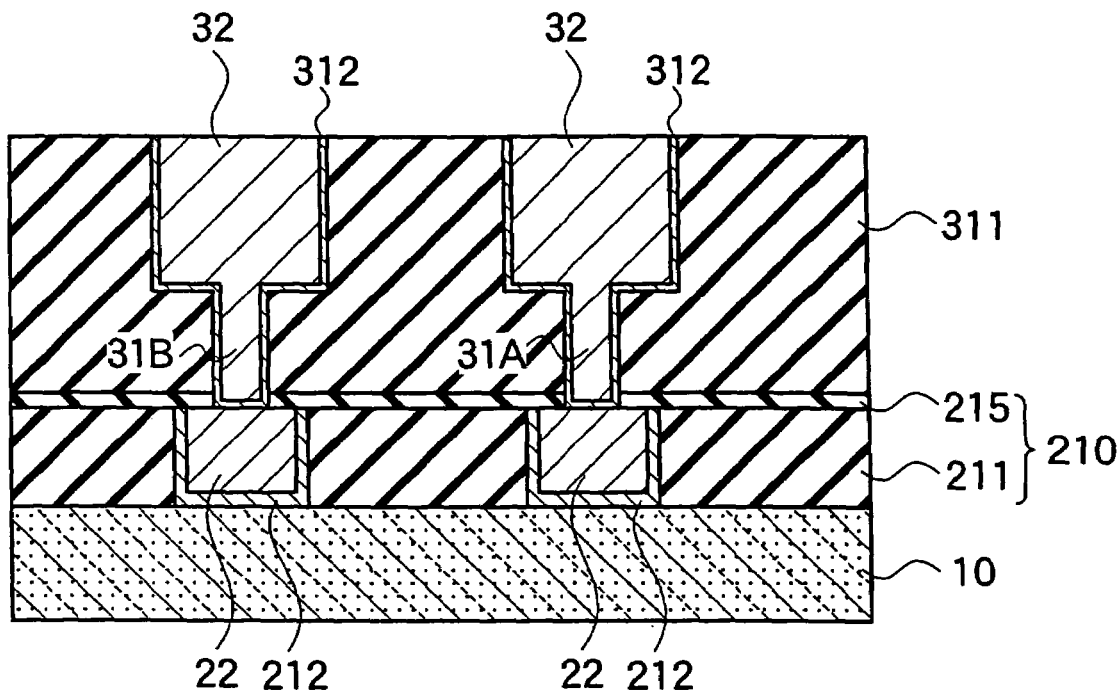
Figure 26:
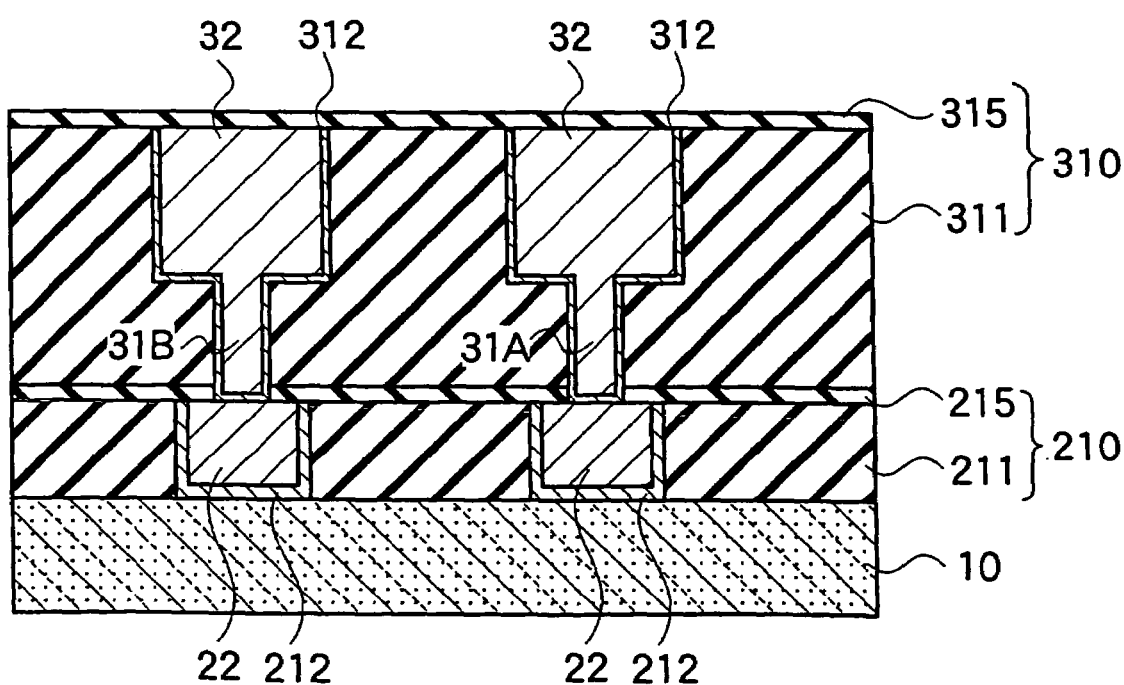

(e) After part of the barrier film 215 exposed in the via holes 31A and 31B is delineated by RIE or the like, as shown in FIG. 23, barrier metal 312 is deposited by PVD, CVD, or the like on the surfaces of the via holes 31A and 31B and the trenches 32A and 32B. On the barrier metal 312, a Cu seed film 313 is deposited by sputtering. As shown in FIG. 24, a Cu layer 314 is deposited on the Cu seed film 313 by plating. As shown in FIG. 25, the Cu layer 314 is polished and planarized by CMP or the like until the surface of the second insulating film 311 is exposed, thus forming the first intermediate wires 32 in the second insulating film 311. As shown in FIG. 26, on the surfaces of the first intermediate wires 32 and the second insulating film 311, a barrier film 315 is formed by CVD or the like to form the second interlayer insulating film 310 composed of the second insulating film 311 and the barrier film 315. The rest of the wires in the intermediate wiring section 30 and wires in the semi-global wiring 40 and the global wiring 50 are sequentially laminated using the aforementioned method, thus forming the semiconductor device shown in FIG. 1.

With the first method of manufacturing the semiconductor device according to the embodiment, the flat vias 31a and 31b each of which has X-direction and Y-direction aspect ratios of not less than 1 are formed by a dual damascene process to be integrated with the overlying first intermediate wire 32. Stresses generated in the CMP process or the like are distributed in two directions orthogonal to each other in the flat vias 31a to 31h. Therefore, the flat vias 31a to 31h can be less likely to be deformed, and damage of the low-dielectric constant films around the flat vias 31a to 31h can be avoided.

Figure 27:
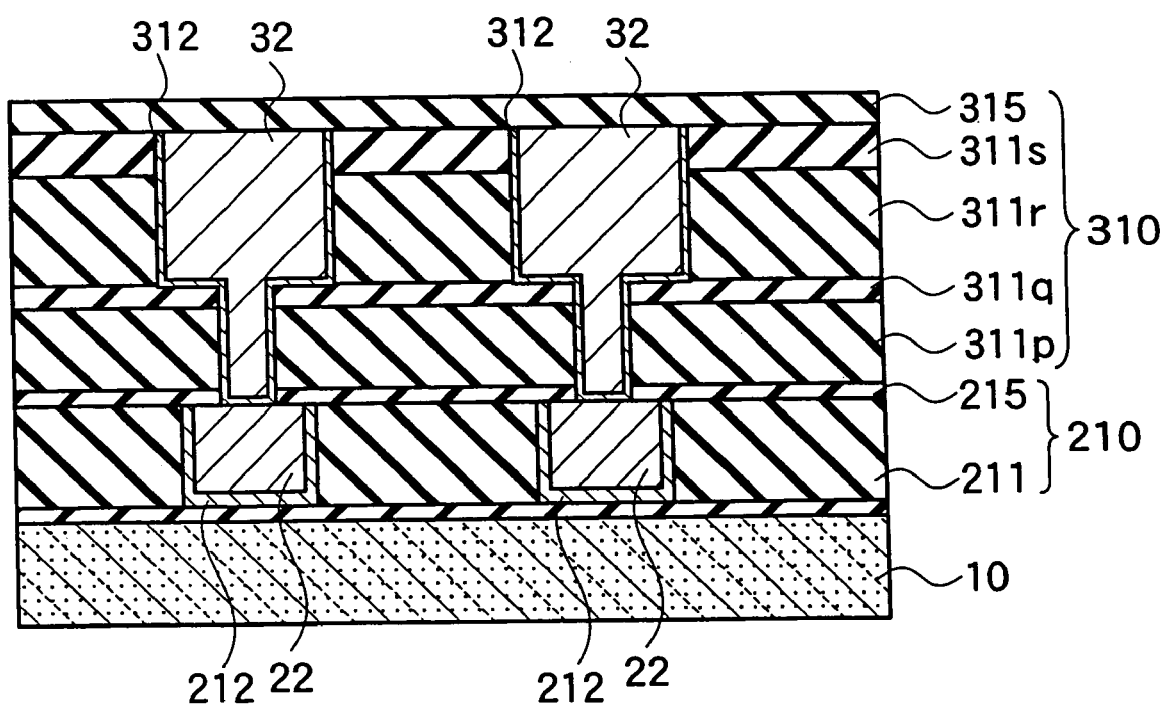
FIG. 27 is a cross-sectional view illustrating another example of the semiconductor device according to an embodiment of the present invention.

Each of the insulating films around the flat vias 31a to 31h may be formed of a plurality of films including a stopper film and a cap film. For example, as shown in FIG. 27, in some cases, the second interlayer insulating film 310 includes an inter-via layer film 311p, a stopper film 311q arranged on the inter-via layer film 311p, a inter-wiring layer film 311r arranged on the stopper film 311q, a cap film 311s arranged on the inter-wiring layer film 311r, and a barrier film 315 arranged on the cap film 311s. When a plurality of films are used for the second interlayer insulating film 310, the materials of the via interlayer film 311p and wiring interlayer film 311r shown in FIG. 27 may be either the same or different.

Second Method of Manufacturing the Semiconductor Device

Next, a description will be given of a second method of manufacturing the semiconductor device according to the embodiment with reference to FIGS. 28 to 41.

Figure 28:
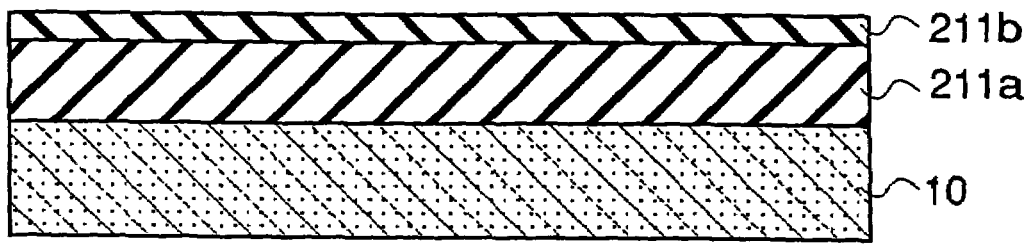
FIGS. 28 through 41 are cross-sectional views illustrating a second method of the semiconductor device according to an embodiment of the present invention.
Figure 29:
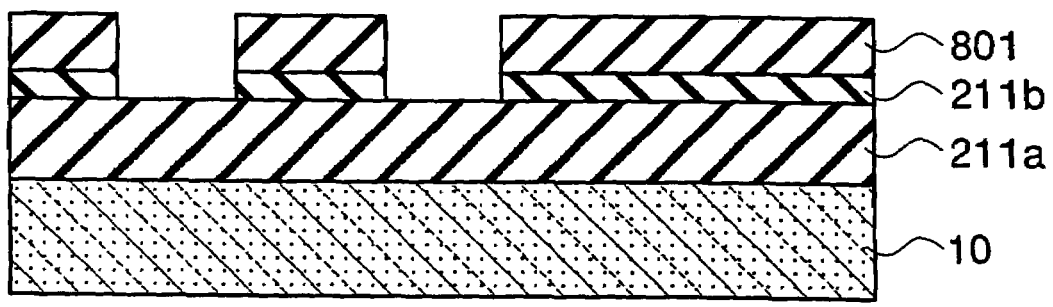
Figure 30:
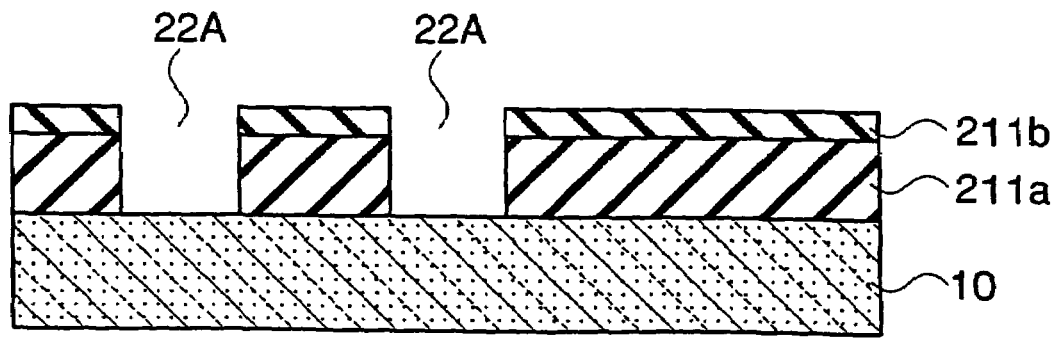

(a) As shown in FIG. 28, a first insulating film 211a is formed by CVD, spin-coating, or the like on the semiconductor chip (semiconductor substrate) 10 on the surface of which elements (not shown) are formed. As the first insulating film 211a, a porous low-dielectric constant film with a relative permittivity of not more than 2.3 is used. Instead of the porous low-dielectric constant film, a $SiO_2$ film, a PSG film, a BPSG film, a $Si_3N_4$ film, a polyimide film, and the like can be used. On the first insulating film 211a, a first cap film 211b is formed. As the first cap film 211b, a $SiO_2$ film, a SiOC film, or the like may be applied. As shown in FIG. 29, the photoresist film 801 is spin-coated on the surface of the first cap film 211b and then delineated by use of a photolithography process. Part of the first cap film 211b is selectively stripped by RIE or the like using the delineated photoresist film 801 as an etching mask to expose part of the surface of the first insulating film 211a. As shown in FIG. 30, the photoresist film 801 is then stripped by etching or the like, and part of the first insulating film 211a is stripped, thus forming trenches 22A.

Figure 31:
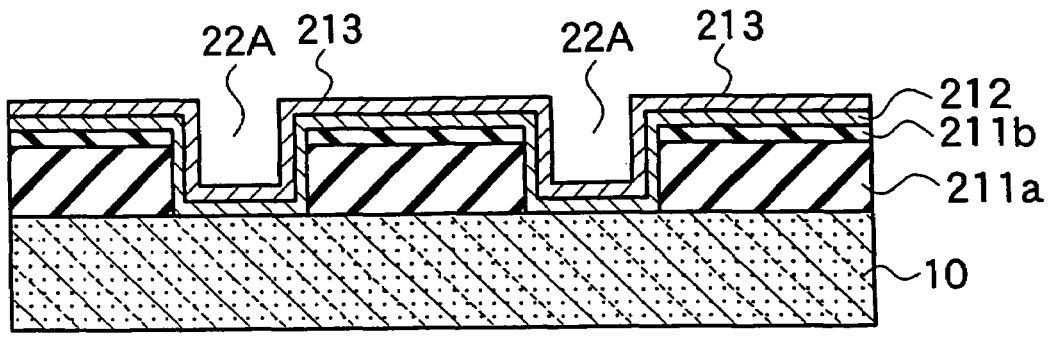
Figure 32:
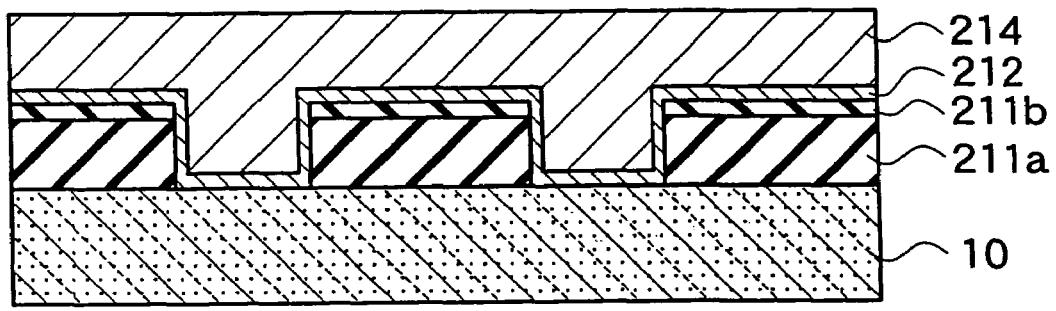
Figure 33:
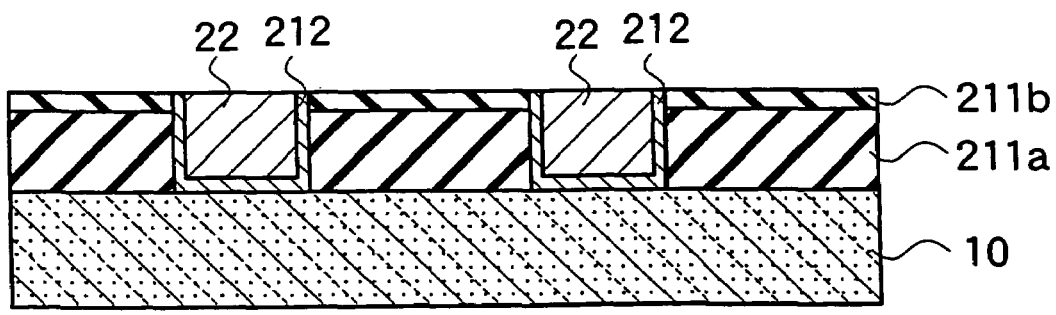

(b) As shown in FIG. 31, the barrier metal 212 is provided by CVD, PVD, or the like on the surfaces of the trenches 22A, the first insulating film 211a, and the first cap film 211b. For the barrier metal 212, Ti, Ta, W, TiN, TaN, WN, and laminated films using these materials are suitable. On the surface of the barrier metal 212 deposited on the trenches 22A, the Cu seed film 213 is formed by sputtering or the like. As shown in FIG. 32, the Cu layer 214 is deposited by plating on the surfaces of the barrier metal 212 and the Cu seed film 213. As shown in FIG. 33, the surfaces of the first cap film 211b and the Cu layer 214 are planarized by CMP to form the first local wires 22.

Figure 34:
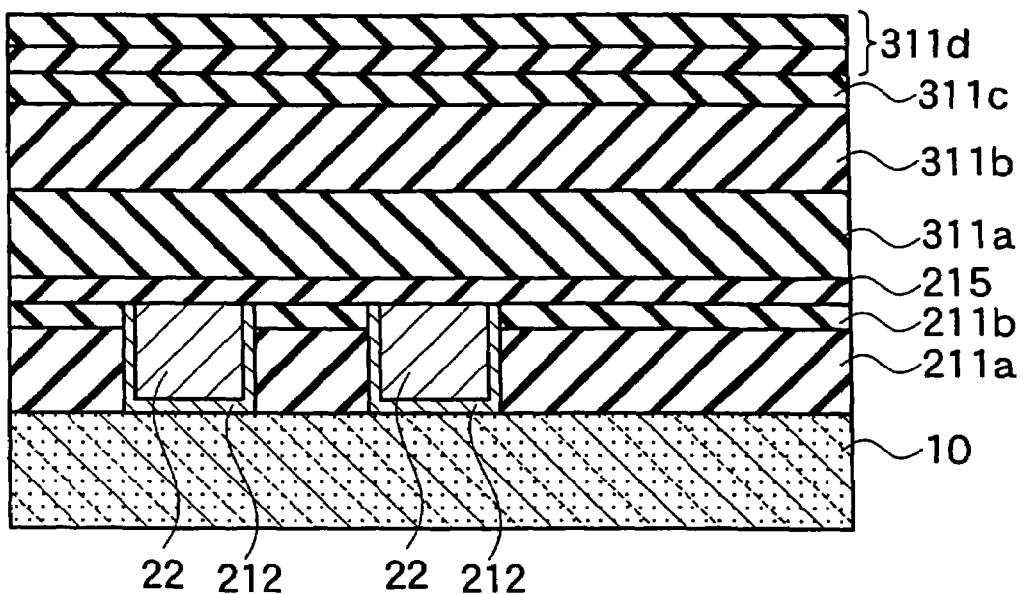

(c) As shown in FIG. 34, on the surfaces of the first local wires 22 and the first cap film 211b, the barrier film 215 is formed by CVD or the like. For the material of the barrier film 215, SiC, SiCN, silicon oxynitride (SiON), SiN, SiO, or the like may be applied. Subsequently, on the barrier film 215, a via interlayer film 311a is formed. For the material of the via interlayer film 311a, SiOC, SiOCH, MSQ, HSG, or the like is suitable. On the via interlayer film 311a, a wiring interlayer film 311b is deposited. For the material of the wiring interlayer film 311b, organic polymer, PAE, CF, or the like may be applied. On the wiring interlayer film 311b, a second cap film 311c made of $SiO_2$ or the like is formed. On the second cap film 311c, a hard mask 311d is formed, which is composed of a single layer or a plurality of layers of any of SiN, SiC, $SiO_2$, SiOC, SiON, and the like laminated.

Figure 35:
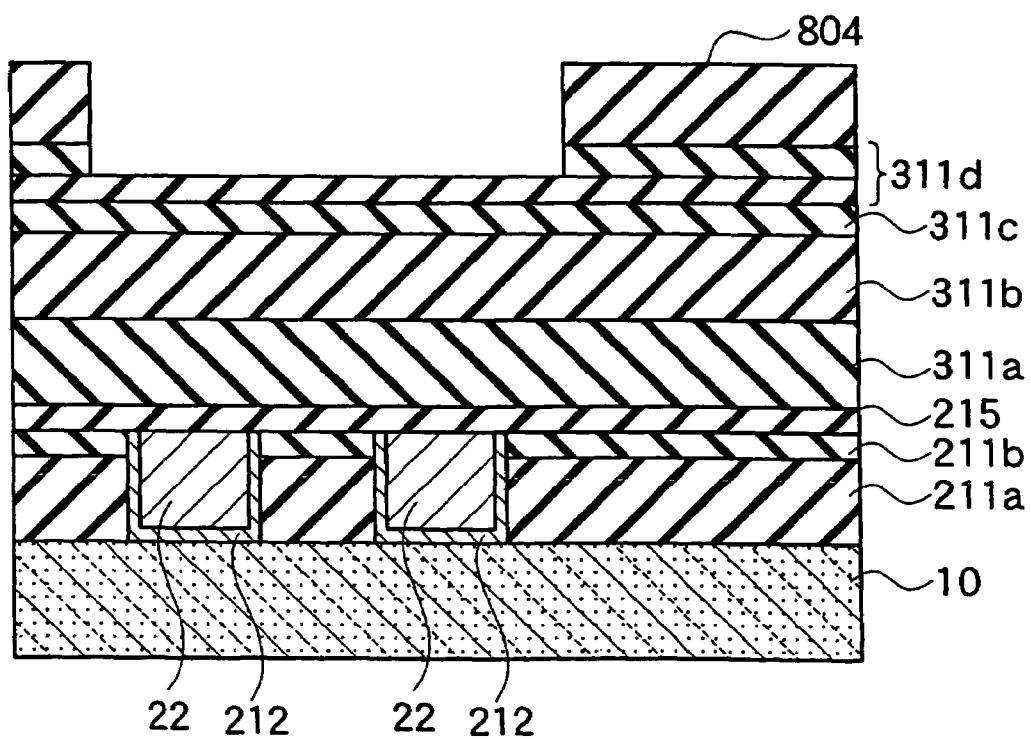
Figure 36:
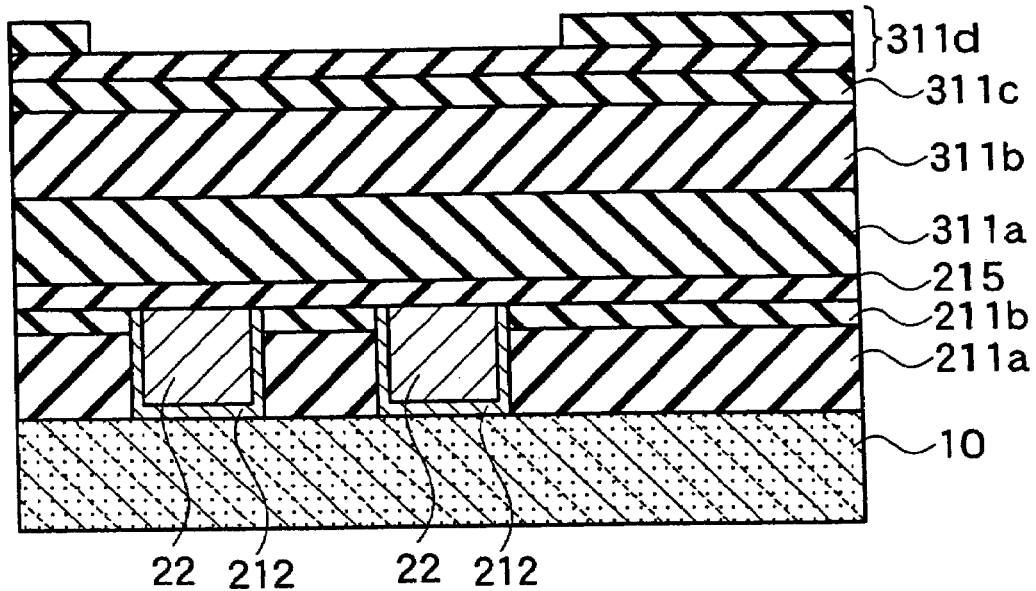
Figure 37:
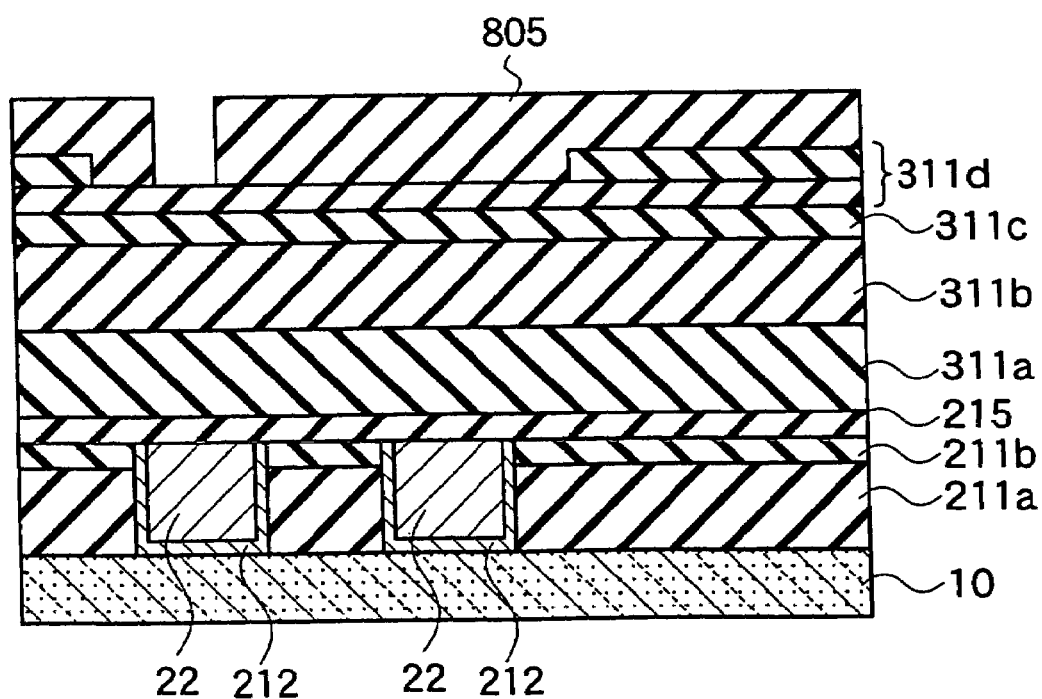
Figure 38:
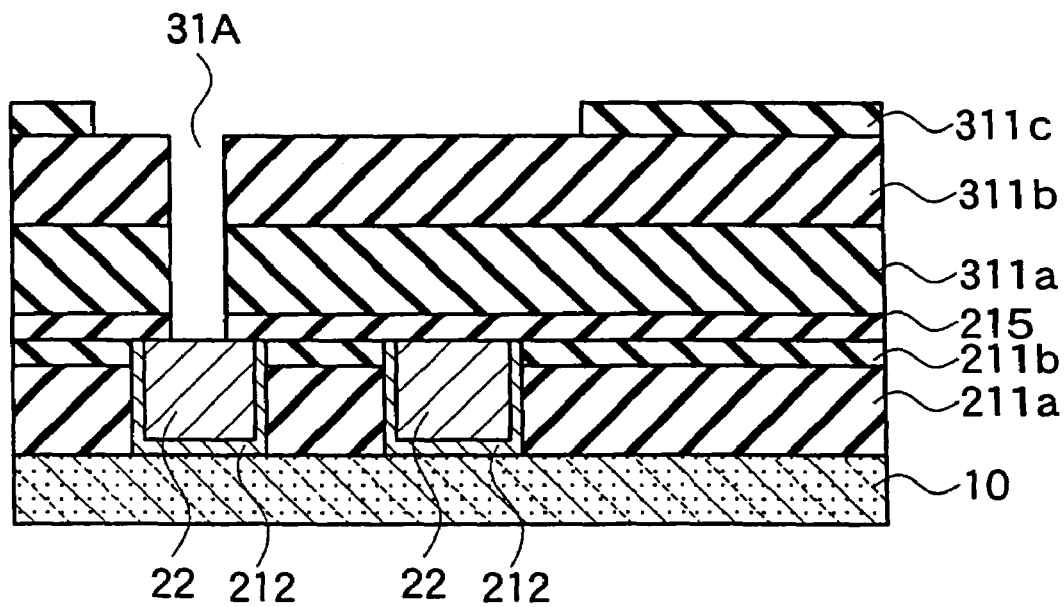

(d) As shown in FIG. 35, on the surface of the hard mask 311d, a photoresist film 804 is spin-coated and then delineated by use of a photolithography process. Part of the hard mask 311d is selectively stripped by RIE or the like using the delineated photoresist film 804 as an etching mask. As shown in FIG. 36, the photoresist film 804 remaining on the hard mask 311d is stripped by etching or the like. As shown in FIG. 37, a photoresist film 805 is spin-coated on the surface of the hard mask 311d part of which are stripped, and delineated by a photolithography process. Part of the hard mask 311d is then stripped by RIE or the like using the delineated photoresist film 805 as an etching mask, and part of the second cap film 311c is selectively stripped. Thereafter, as shown in FIG. 38, a via hole 31A is formed, which penetrates the first barrier film 215, the via interlayer film 311a, and the wiring interlayer film 311b and connects to one of the first local wires 22.

Figure 39:
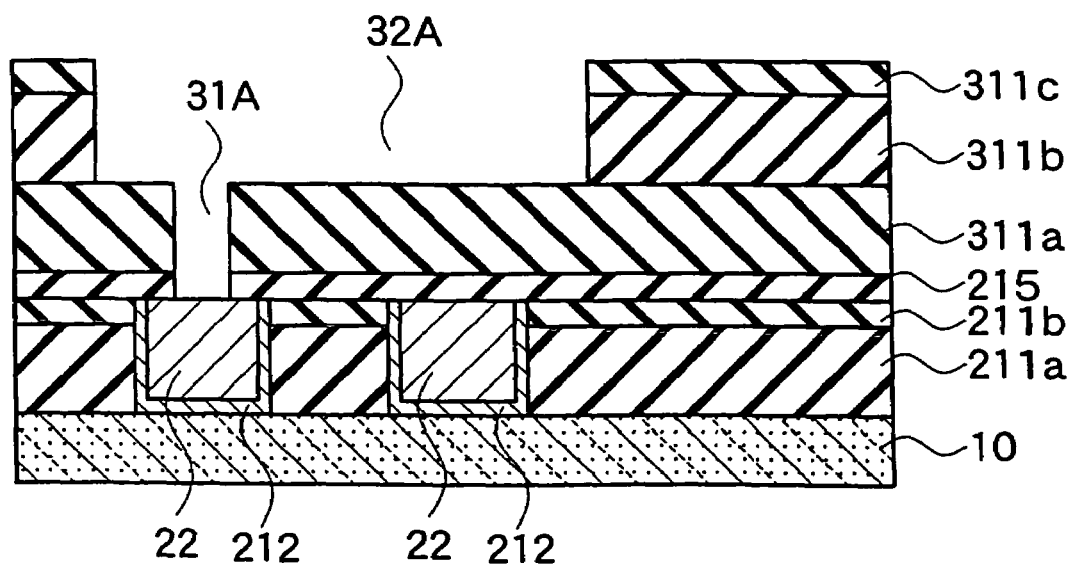

(e) Subsequently, a photoresist film is formed on part of the surfaces of the via interlayer film 311a, the wiring interlayer film 311b, and the second cap film 311c within the via hole 31A. Part of the wiring interlayer film 311b is then stripped with the delineated photoresist film as an etching mask. Thereafter, the remaining photoresist film is stripped to form the trench 32A as shown in FIG. 39.

Figure 40:
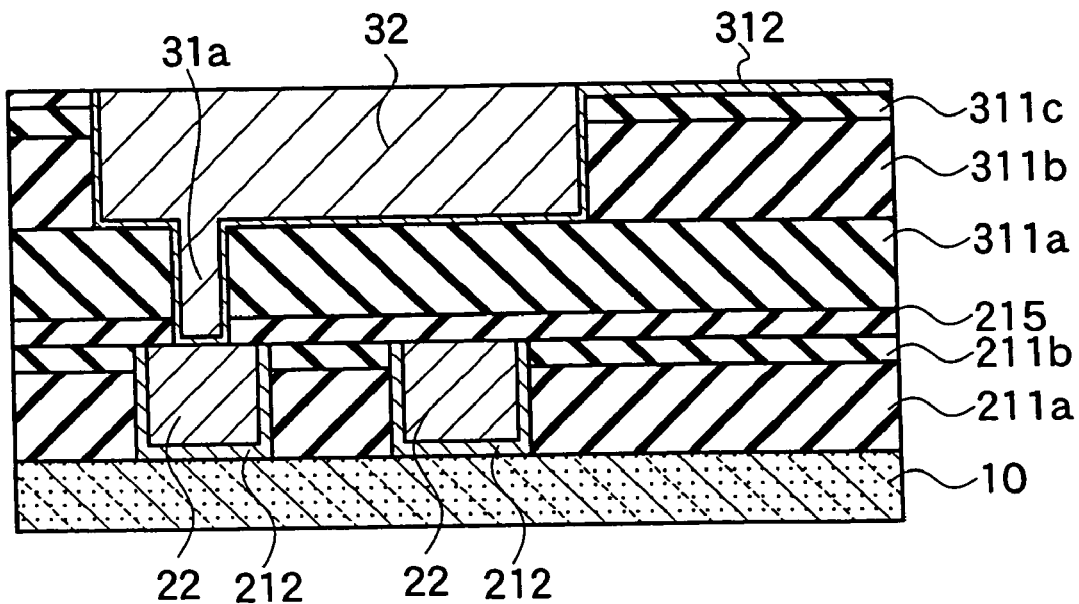
Figure 41:
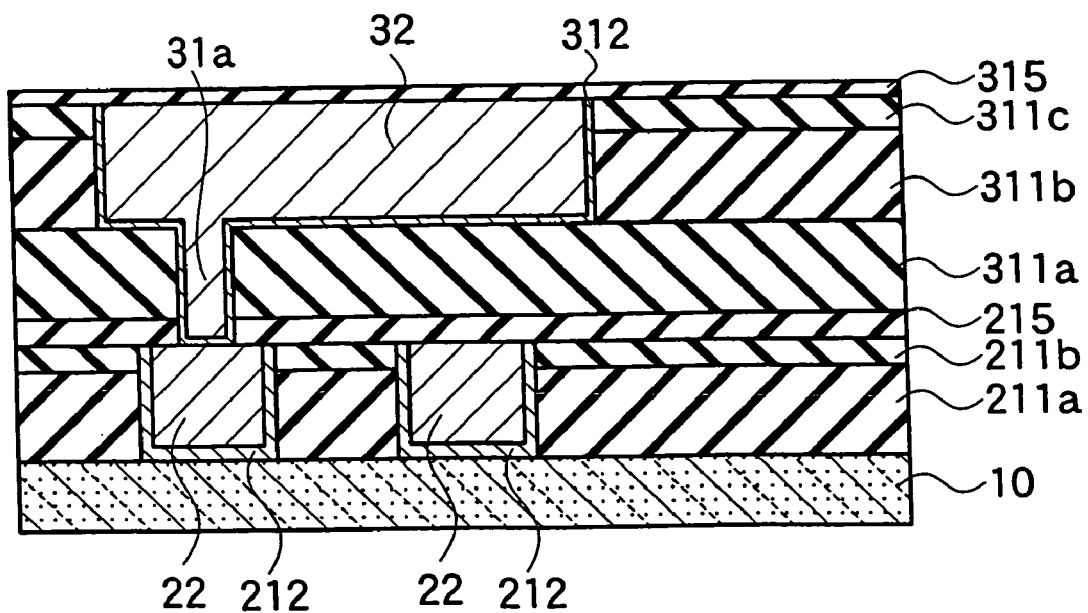

(f) As shown in FIG. 40, on the surfaces of the via hole 31A and the trench 32A, the barrier metal 312 is formed by CVD, PVD, or the like. On the barrier metal 312, a Cu seed film is deposited by sputtering. On the Cu seed film, a Cu layer is deposited by plating. Subsequently, the Cu layer is polished and planarized by CMP or the like until the surface of the second cap film 311c is exposed. As a result, the flat via 31a is formed in the via interlayer film 311a, and the first intermediate wire 32 connected to the flat via 31a is formed within the wiring interlayer film 311b. As shown in FIG. 41, on the surfaces of the first intermediate wire 32 and the second cap film 311c, the second barrier film 315 is formed by CVD or the like. The rest of the wires in the intermediate wiring 30 and wires in the semi-global wiring 40 and the global wiring 50 are sequentially laminated in this manner, thus completing the semiconductor device according to an embodiment.

(First Modification of the Embodiment)

Figure 42:
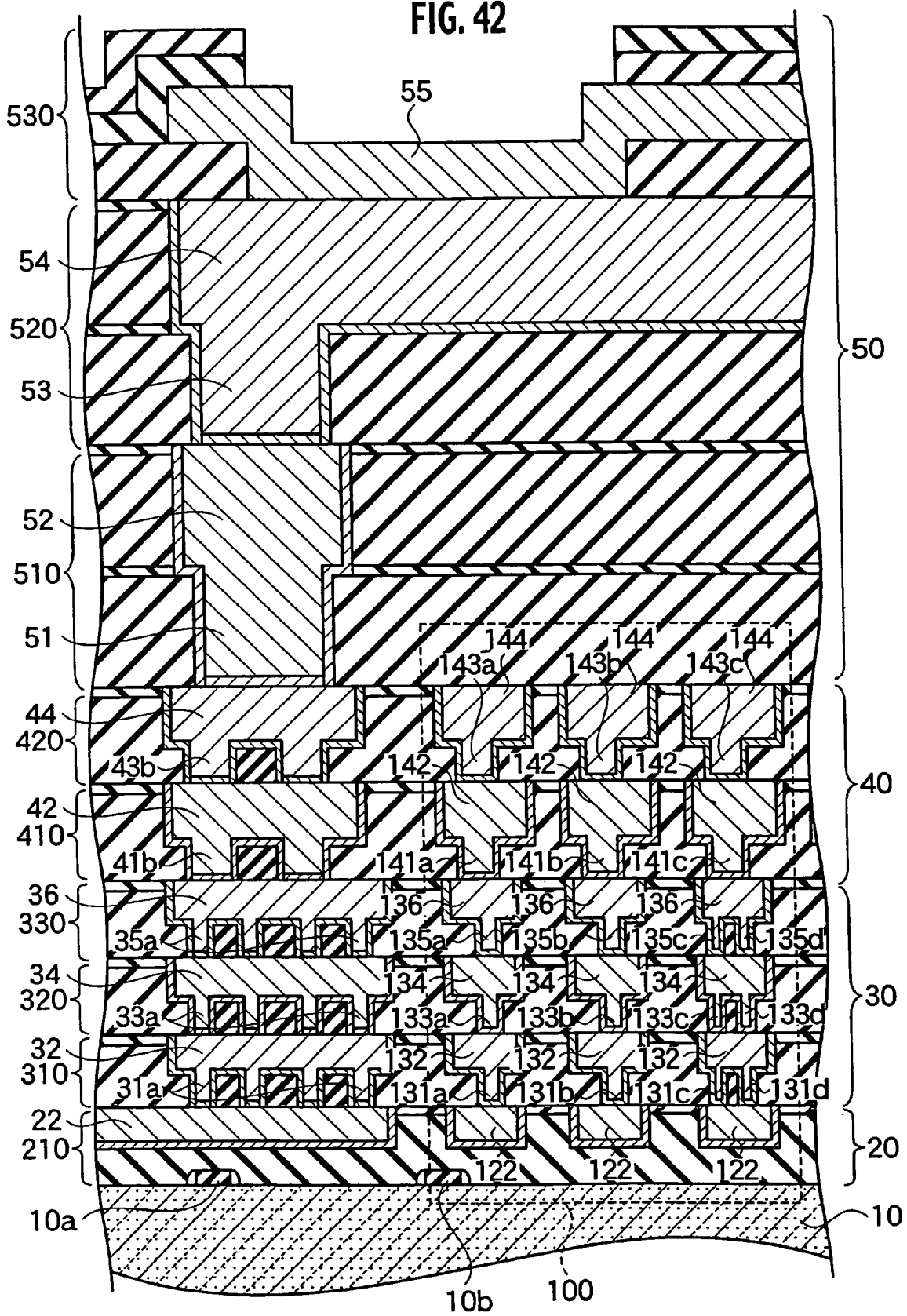
FIG. 42 is a cross-sectional view illustrating an example of the semiconductor device according to a first modification of the present invention.

As shown in FIG. 42, a semiconductor device according to a first modification of the embodiment includes a mesh pattern section 100 formed in the local wiring 20, the intermediate wiring 30, and the semi-global wiring 40. First mesh patterns 122 are embedded in an area adjacent to the first local wire 22 in the first interlayer insulating film 210. The first mesh patterns 122 are connected to second mesh patterns 132 in the overlying layer through flat vias 131a to 131d. The second mesh patterns 132 are connected to third mesh patterns 134 in the overlying layer through flat vias 133a to 133d. The third mesh patterns 134 are connected to fourth mesh patterns 136 in the overlying layer through flat vias 135a to 135d. The fourth mesh patterns 136 are connected to fifth mesh patterns 142 in the overlying layer through flat vias 141a to 141c. The fifth mesh pattern 142 is connected to a sixth mesh pattern 144 in an overlying layer through flat vias 143a to 143c. The first to sixth mesh patterns 122, 132, 134, 136, 142, and 144 are made of Cu, and the shape of each metal layer viewed from the top has, for example, the "mesh structure" shown in FIG. 10A. Each of the shapes of the flat vias 131a to 131d, 133a to 133d, 135a to 135d, 141a to 141c, and 143a to 143c, which are integrally connected to the first to sixth mesh patterns 122, 132, 134, 136, 142, and 144, respectively, may be any shape of the flat vias 31a to 31h shown in the embodiment. With the semiconductor device according to the first modification of the embodiment, in the local wiring 20, the intermediate wiring 30, and the semi-global wiring 40 in which the low-dielectric constant films are arranged, the flat vias 131a to 131d, 133a to 133d, 135a to 135d, 141a to 141c, and 143a to 143c and the first to sixth mesh patterns 122, 132, 134, 136, 142, and 144 integrally form "metal walls". The insulating films (low-dielectric constant films, in particular) therearound are surrounded by the metal walls and thereby increase in mechanical strength. Therefore, the insulating films are not less likely to be broken, and the reliability of the semiconductor device may be increased.

(Second Modification of the Embodiment)

Figure 43:
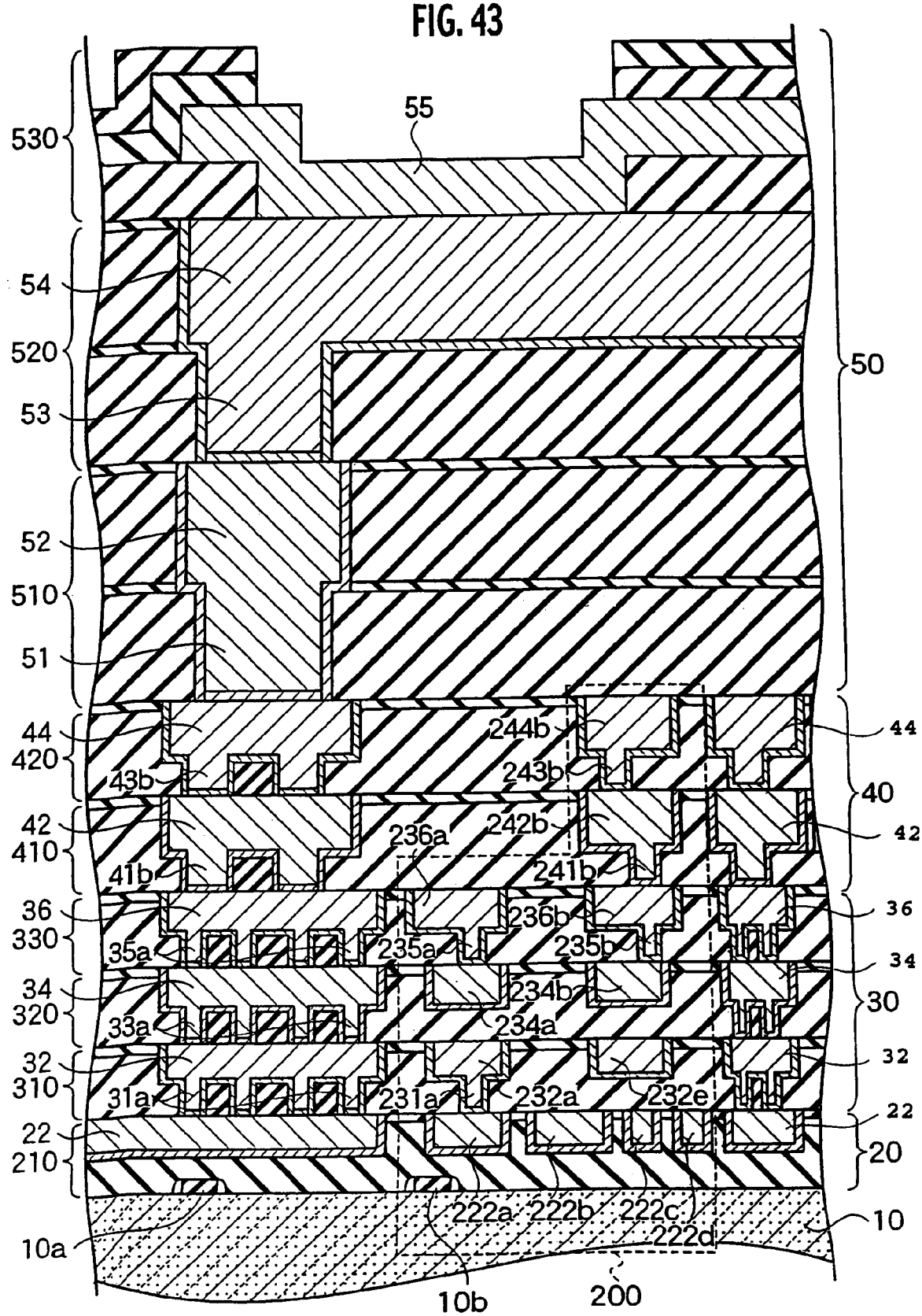
FIG. 43 is a cross-sectional view illustrating an example of the semiconductor device according to a second modification of the present invention.

As shown in FIG. 43, a semiconductor device according to a second modification of the embodiment includes a dummy wiring section 200 embedded in the local wiring 20, the intermediate wiring 30, and the semi-global wiring 40.

The dummy wiring section 200 includes, other than wires which are needed and designed for circuit operations of the semiconductor device, wires which are arranged for filling gaps between the wires necessary for the circuit operations and are not related to the circuit operations. In an area where the dummy wiring section 200 is arranged, wires other than the dummy wires, which are needed and designed for the circuit operations, are partially mixed. As shown in FIG. 43, the dummy wiring section 200 includes a first level dummy wire 222a arranged in the same layer as the first local wire 22 spaced from the first local wire 22, a second level dummy wire 232a in the same layer as the first intermediate wire 32 spaced from the first intermediate wire 32, and a second flat via 231a arranged between the first and second level dummy wires 222a and 232a.

On the same layer as the first local wire 22, in addition to the first level dummy wire 222a, first level dummy wires 222b, 222c, and 222d are arranged. The first level dummy wires 222b, 222c, and 222d are connected to wires in the overlying layer, which are not shown in the cross section of FIG. 43. On the same layer as the first intermediate wire 32, in addition to the second level dummy wire 232a, a wire 232e is arranged. The wire 232e is connected to a wire in the overlying layer, which is not shown in the cross section of FIG. 43. On the same layer as the second intermediate wire 34, third level dummy wires 234a and 234b are arranged. The third level dummy wires 234a and 234b are connected to fourth dummy wires 236a and 236b in the overlying layer through second flat vias 235a and 235b, respectively. The fourth dummy wire 236b is connected to a fifth dummy wire 242b arranged in the same layer as the first semi-global wire 42 through the second flat via 24 lb. The fifth dummy wire 242b is connected to a sixth dummy wire 244b in the overlying layer through a second flat via 243b.

Figure 44:
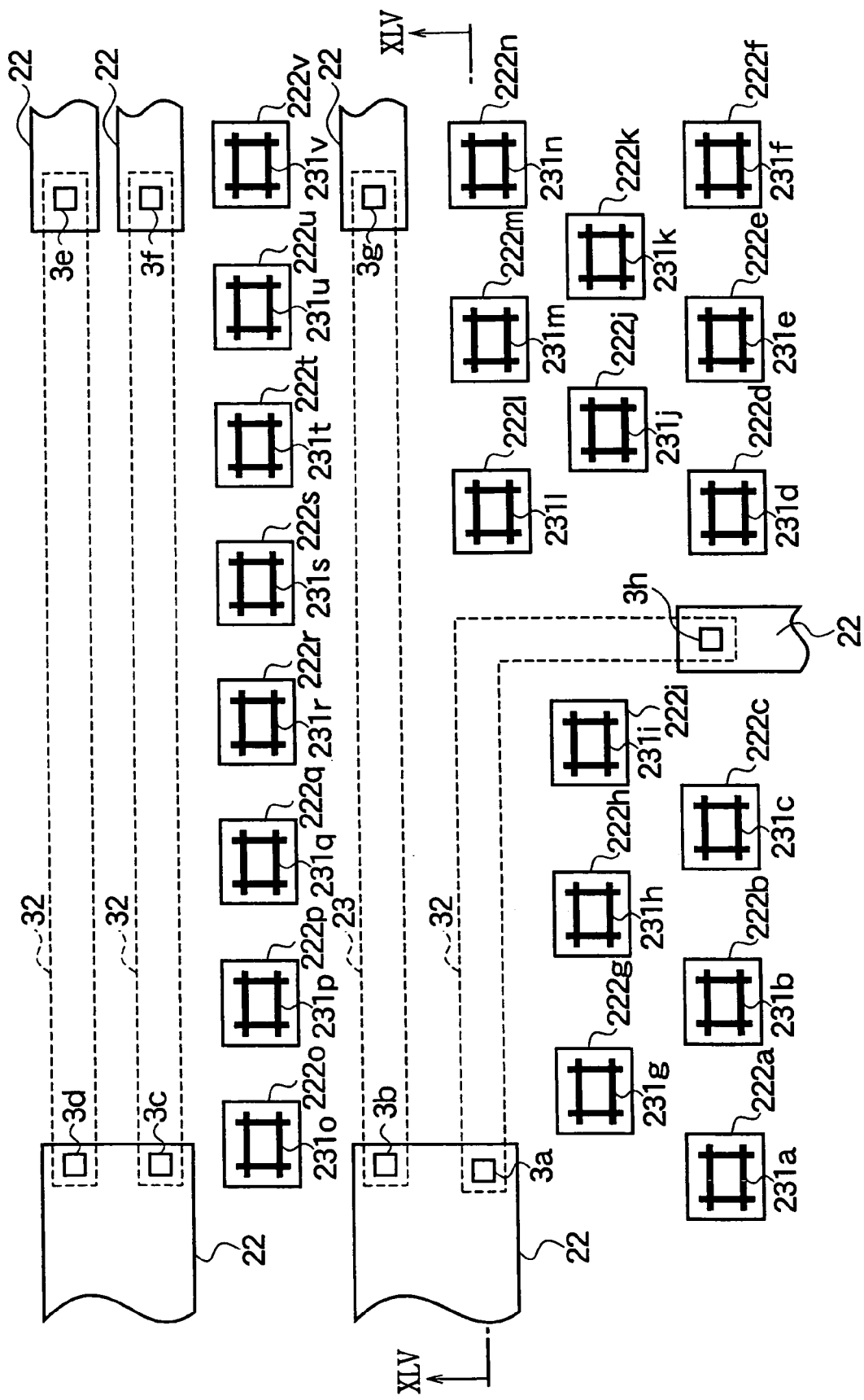
FIG. 44 is a conceptual diagram illustrating a top view of the layer where the first local wirings as shown in FIG. 43 are disposed.

FIG. 44 shows an example of a top plan view of the layer where the first local wires 22 are arranged. The first local wires 22 are connected to the first intermediate wires 32 in the overlying layer through vias 3a, 3b, 3c, 3d, and 3e. Each of the vias 3a to 3e may be a via with an aspect ratio of length to height of about 1 to 1.7, which is generally used at present, or may be any one of the flat vias 31a to 31h shown in FIGS. 2 to 6. Around the first local wires 22, the first level dummy wires 222a to 222v are arranged spaced from each other. The flat vias 231a to 231v, whose shapes viewed from the tops are #-shaped in the top view, are connected to the upper sides of the first level dummy wires 222a to 222v.

Figure 45:
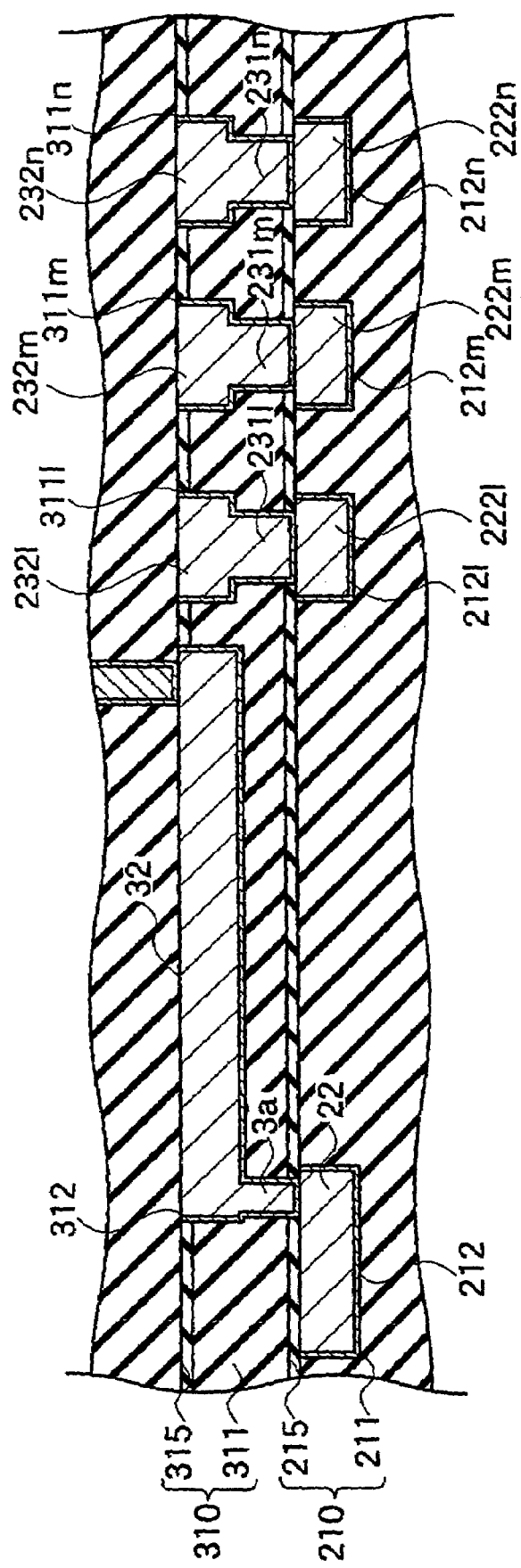
FIG. 45 is a cross-sectional view taken line XLV—XLV in FIG. 44.

FIG. 45 shows an example of a cross-sectional view taken on a line XLV—XLV in FIG. 44. As shown in FIG. 45, the first level dummy wire 222l is spaced from the first local wire 22 and embedded in the first interlayer insulating film 210 with barrier metal 212l interposed therebetween. Above the first level dummy wire 222l, a second flat via 231l and a second level dummy wire 232l integrated with the second flat via 231l are embedded in the second interlayer insulating film 310 with barrier metal 311l interposed therebetween. The second flat via 231l has an aspect ratio of the lengths to the height of not less than 1. Above the first level dummy wire 222m, a second flat via 231m and a second level dummy wire 232m integrated with the second flat via 231m are embedded in the second interlayer insulating film 310 with barrier metal 311m interposed therebetween. The second flat via 231m has an aspect ratio of the lengths to the height of not less than 1. Above the first level dummy wire 222n, a second flat via 231n and a second level dummy wire 232n integrated with the second flat via 231n are embedded in the second interlayer insulating film 310 with barrier metal 311n interposed therebetween. The second flat via 231n has an aspect ratio of the lengths to the height of not less than 1.

With the semiconductor device according to the second modification of the embodiment, the first level dummy wires 222a to 222v, the second flat vias 231a to 231v, and the second level dummy wires 232a to 232v are arranged in the same layer as the layer where the fist local wires 22 and the first intermediate wires 32 are arranged. Therefore, the density of metal wiring patterns is constant, which facilitates processing such as lithography or etching and can further facilitate planarization of the insulating films by CMP. Consequently, damage of low-dielectric constant films around metal wires can be avoided.

In the semiconductor device shown in FIG. 44, the description has been given taking the vias connecting the first level dummy wires 222a to 222v and the second level dummy wires 232a to 232v as an example for the second flat vias 231a to 232v, whose shapes viewed from the tops are #-shaped. However, it is possible to adopt any of the cross-shape shown in FIG. 4 and the H-shape, the ellipse, the quadrangle, the meander shape, and the like shown in FIGS. 5 and 6. Furthermore, it is obvious that two-dimensional arrangements, combinations of shapes, and the density of these vias can be properly modified.

Desirably, the first level dummy wires 222a to 222v are formed to be sufficiently smaller than the first local wires 22 adjacent thereto in the same layer. Specifically, it is agreeable that at least a side of each of the first level dummy wires 222a to 222v has a length of not more than a tenth of the minimum interwire distance between the first local wires 22. By setting the length of at least a side of each of the first level dummy wires 222a to 222v not more than a tenth of the minimum interwire distance between the first local wires 22, more first level dummy wires 222a to 222v can be arranged in a gap between wires.

When the layer where the first local wires 22 are arranged is viewed from the top, the ratio of exposed part of the fist dummy wires 222a to 222v (hereinafter, referred to as a cover ratio) is desirably about 30 to 60% of the entire exposed surfaces. If the cover ratio of the first level dummy wires 222a to 222v is smaller than 30% of the entire exposed surfaces, there is less effect on increasing the uniformity on the wafer planarized surface, and the uniformity thereof becomes the same level as that in the case where the first level dummy wires 222a to 222v are not arranged. On the other hand, if the cover ratio is more than 60% of the entire exposed surfaces, the first local wires 22 are polished first, and effects on suppressing erosion and dishing and the like are less likely to appear.

(Third Modification of the Embodiment)

Figure 46:
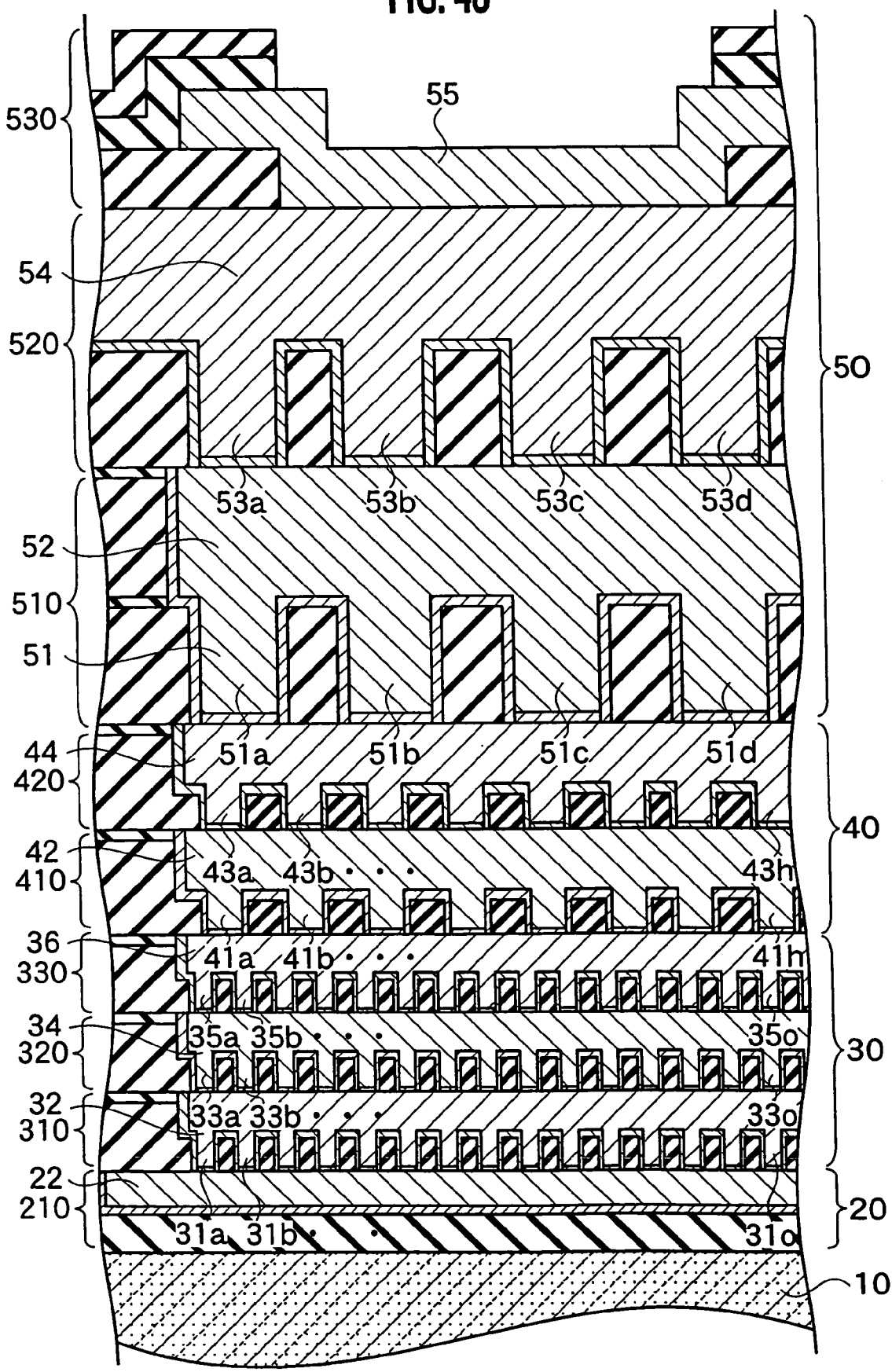
FIG. 46 is a cross-sectional view illustrating a semiconductor device according to a third modification of the present invention.

In a semiconductor device according to a third modified example of the embodiment includes, as shown in FIG. 46, the flat vias 31a, 31b . . . as shown in FIGS. 2 to 6 are arranged on an entire surface of each metal wire embedded in each of the local wiring 20, the intermediate wiring 30, the semi-global wiring 40, and the global wiring 50.

The first local wire 22 is connected to the first intermediate wire 32 in the overlying layer through flat vias 31a, 31b . . . , and 31o. The first intermediate wire 32 is connected to the second intermediate wire 34 in the overlying layer through flat bias 35a to 35o.

The third intermediate wire 36 is connected to the first semi-global wire 42 in the overlying layer through flat vias 41a, 41b . . . , and 41h. The first semi-global wire 42 is connected to the second semi-global wire 44 in the overlying layer through flat bias 43a, 43b . . . , and 43h. The second semi-global wire 44 is connected to the first global wire 52 in the overlying layer through flat vias 51a, 51b, 51c, and 51d. The first global wire 52 is connected to the second global wire (connecting pad) 54 in the overlying layer through flat bias 53a, 53b, 53c, and 53d. Others are substantially the same as those of the semiconductor device shown in FIG. 1.

Figure 47:
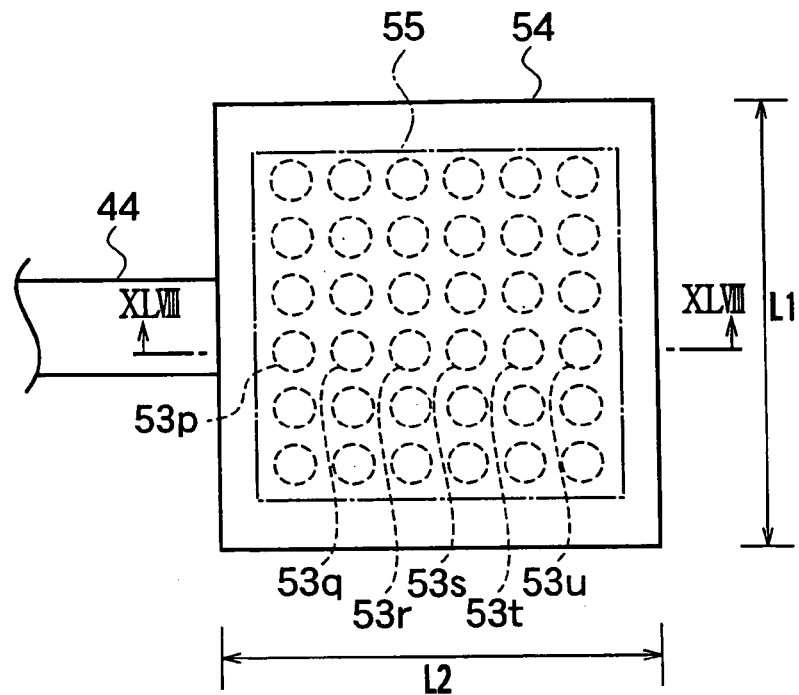
FIG. 47 is a plane view looked from the upper surface side of the connection pad as shown in FIG. 46.
Figure 48:
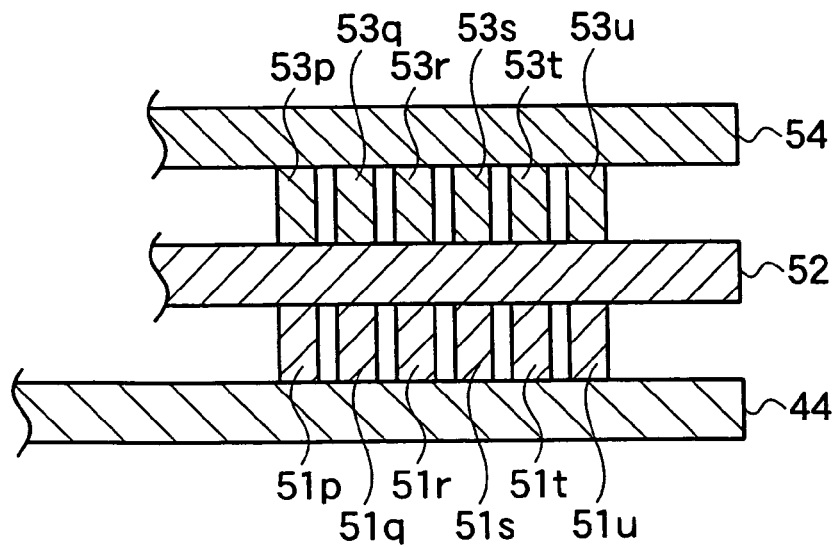
FIG. 48 is a cross-sectional view taken on line in XLVIII—XLVIII in FIG. 47.

FIG. 47 shows an example of a plan view from the top of the connecting pad 54, and FIG. 48 shows a cross sectional view taken on a line XLVIII—XLVIII in FIG. 47. In FIGS. 47 and 48, insulating films are not shown. As shown in FIG. 47, on the connecting pad 54 whose shape viewed from the top is quadrangular, a plurality of flat vias 53p, 53q, 53r . . . , whose shapes viewed from the tops are quadrangular, are arranged in a matrix. The pad electrode 55 is arranged in an area surrounded by a dotted line on the connecting pad 54. As shown in FIG. 48, under the flat vias 53p, 53q, 53r . . . , the first global wire 52, whose shape viewed from the top is quadrangular, is arranged. Under the first global wire 52, the second semi-global wire 44 is arranged with the flat vias 53p, 53q, 53r . . . interposed therebetween. Desirably, the lengths L1 and L2 of the connecting pad 54 are about 50 to 100 μm.

Figure 49:
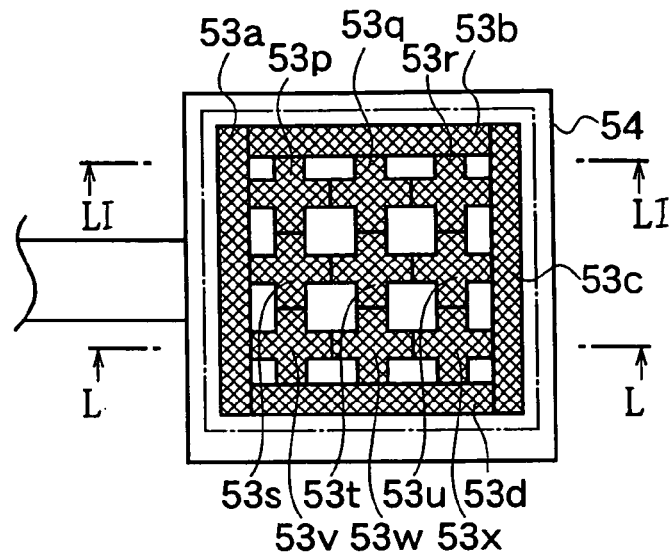
FIG. 49 is a plane view looked from the upper surface side of the connection pad as shown in FIG. 46.
Figure 50:
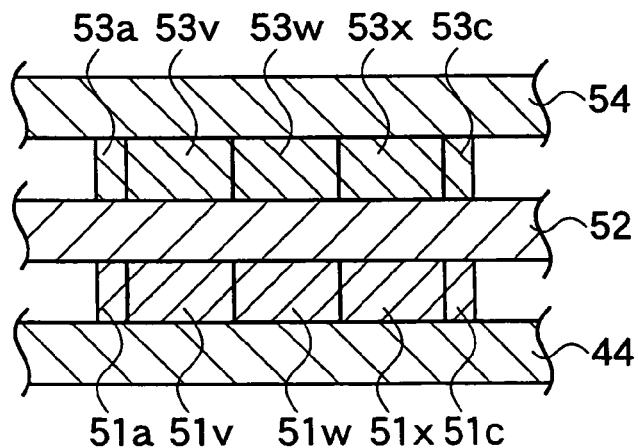
FIG. 50 is a cross-sectional view taken on line in L—L in FIG. 49.
Figure 51:
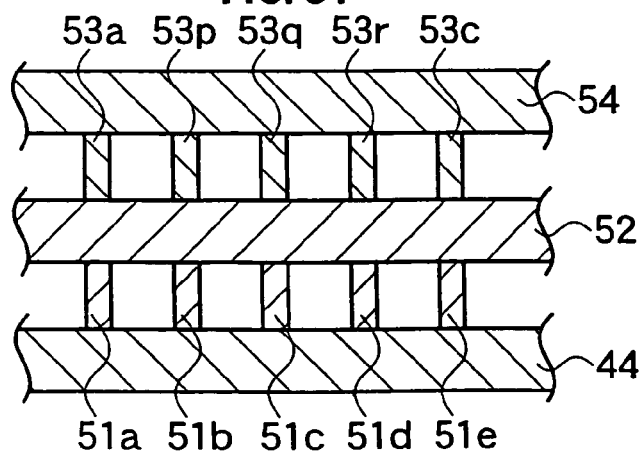
FIG. 51 is a cross-sectional view taken on line in LI—LI in FIG. 49.

FIG. 49 shows another example which can be adopted as the plan view from the top of the connecting pad 54, and FIGS. 50 and 51 are cross-sectional views taken on lines L—L and LI—LI in FIG. 49, respectively. In FIGS. 49 to 51, the insulating films are not shown. As shown in FIG. 49, on the connecting pad 54, whose shape viewed from the top is quadrangular, the flat vias 53a to 53d, whose shapes viewed from the tops are quadrangular, are arranged, and cross-shaped flat vias 53p, 53q . . . are arranged in an area surrounded by the flat vias 53a to 53d, thus forming the mesh structure shown in FIG. 10A as a whole. In areas among the mesh structure formed of the flat vias 53a, 53b . . . , low-dielectric constant films are arranged.

As shown in FIG. 50, between the connecting pad 54 and the first global wire 52, a metal wall is formed of the plurality of flat vias 53a, 53v, 53w, 53x, and 53c, whose shapes viewed from the sides are rectangular. Between the first global wire 52 and the second semi-global wire 44, a metal wall is formed of the plurality of flat vias 51a, 51v, 51w, 51x, and 51c, whose shapes viewed from the sides are rectangular. As shown in FIG. 51, in the G—G cross section, the flat vias 53a, 53p, 53q, 53r, and 53c are arranged between not-shown low-dielectric constant films spaced from each other. The flat vias 51a, 51p, 51q, 51r, and 51c are arranged between the first global wire 52 and the second semi-global wire 44 are arranged between not-shown low-dielectric constant films spaced from each other.

With the semiconductor device according to the third modification of the embodiment, the flat vias 31a, 31b . . . , the flat vias 41a, 41b . . . , and the flat vias 53a, 53b . . . are embedded in parts of the wiring layers under the pad electrode 55, which is most likely to be subjected to stresses in the bonding process. Each of the flat vias 31a, 31b ..., the flat vias 41a, 41b ..., and the flat vias 53a, 53b ... has a shape less likely to be deformed in the horizontal direction in FIG. 46, and therefore, it is possible to avoid damage of the low-dielectric constant films in the case where the low-dielectric constant films are used as the interlayer insulating films.

(Fourth Modification of the Embodiment)

Figure 52:
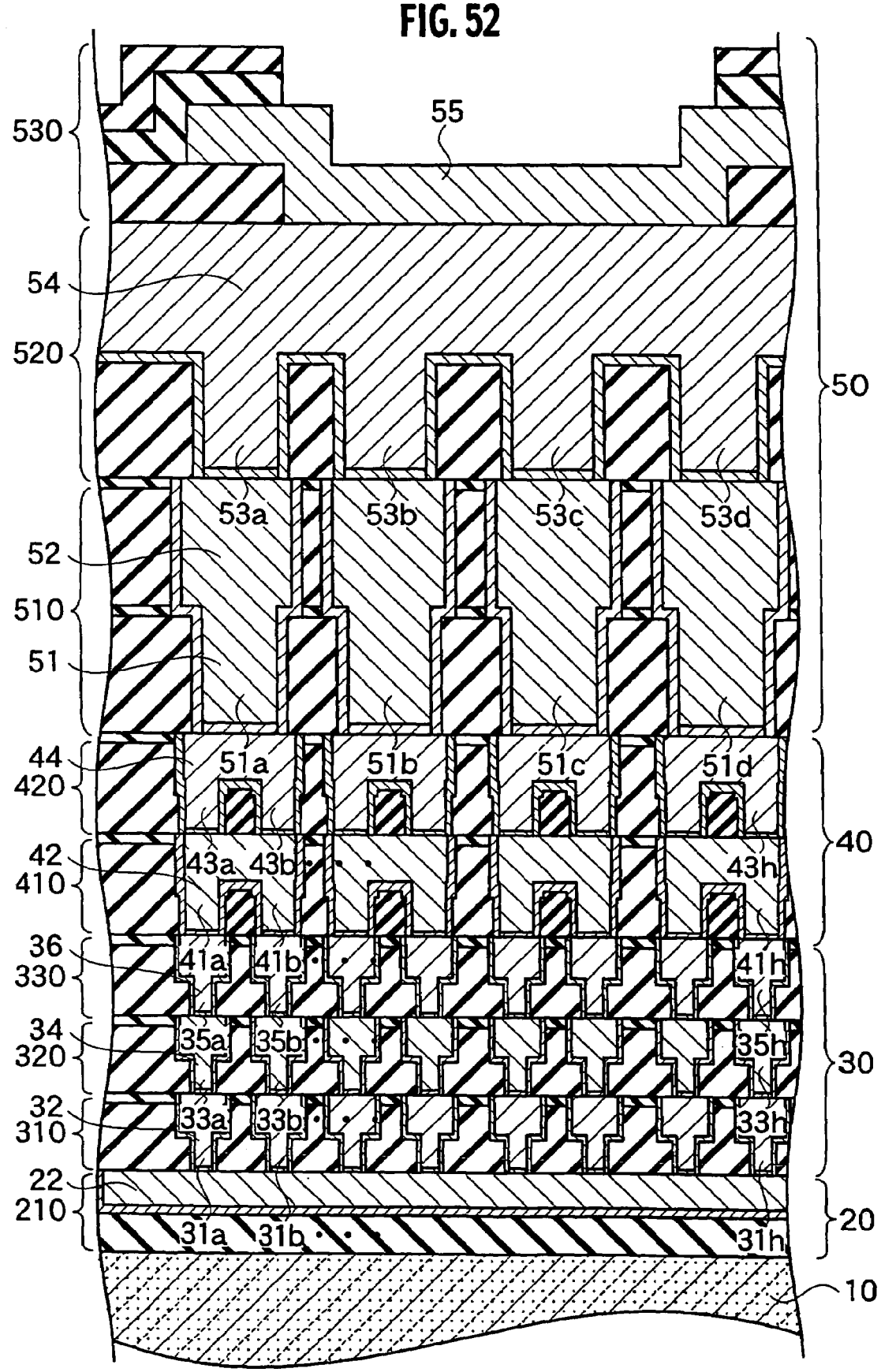
FIG. 52 is a cross-sectional view illustrating the semiconductor device according to a fourth modification of the present invention.

In a semiconductor device according to a fourth modification of the embodiment, as shown in FIG. 52, metal wiring embedded in each of the local wiring 20, the intermediate wiring 30, the semi-global wiring 40, and the global wiring 50 has a mesh shape as shown in FIG. 49. The others are substantially the same as those of the semiconductor device shown in FIG. 46.

Figure 53:
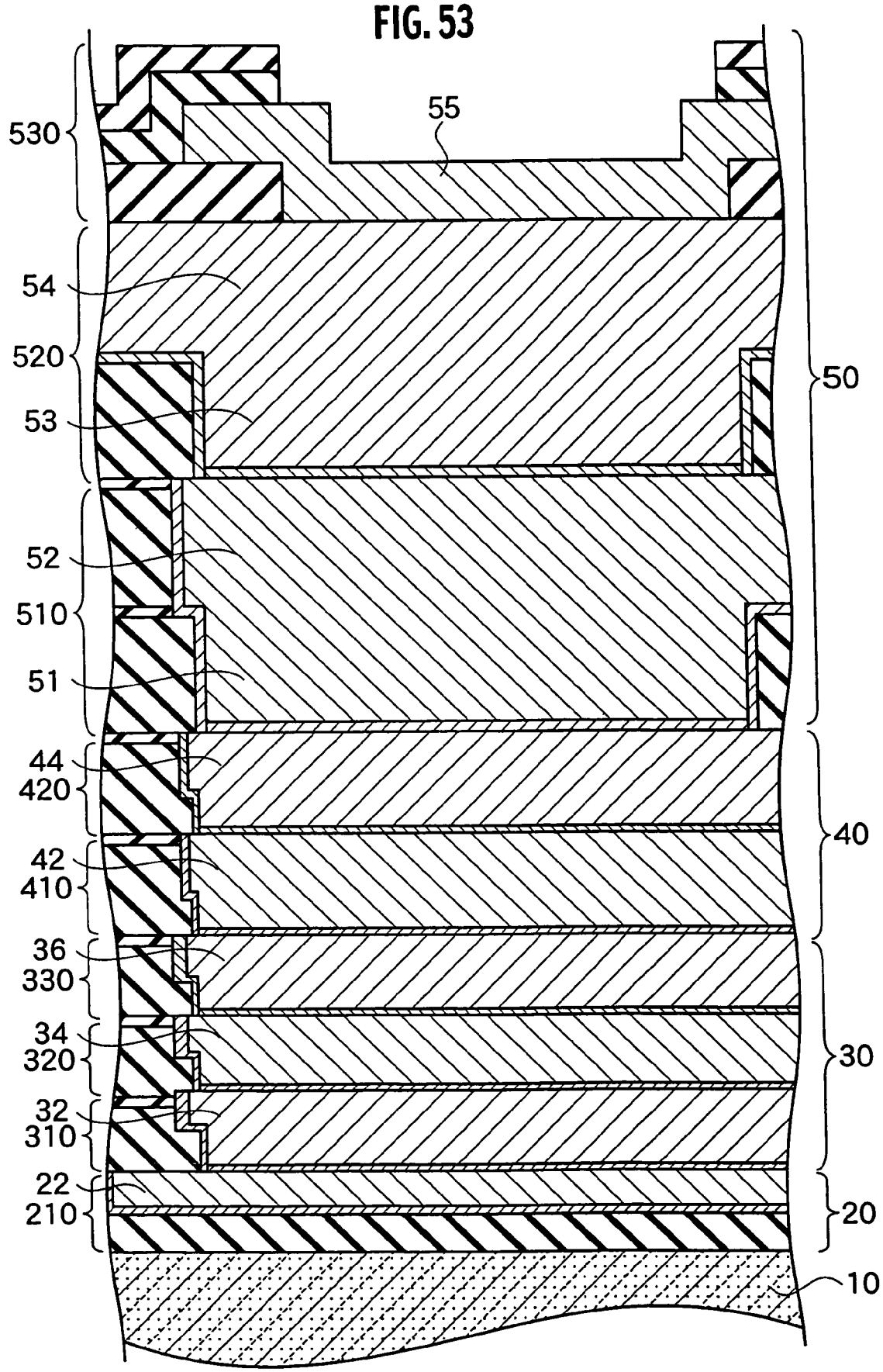
FIG. 53 is a cross-sectional view seeing from another section of the semiconductor device of FIG. 52.

With the semiconductor device according to the fourth modification of the embodiment, as shown the cross section in FIG. 53, the metal wiring and the flat vias are connected to each other to form metal walls in the wiring layers between the semiconductor chip 10 and the pad electrode 55. By surrounding the insulating films with the metal walls, the mechanical strength to stresses in the CMP and bonding processes is increased, thus avoiding damages of the interlayer insulating films. Furthermore, the flat vias and the metal wires are formed in meshes, and therefore, the density of metal patterns within the semiconductor device becomes uniform, thus facilitating the processing such as lithography and etching.

(Other Embodiments)

Various modifications will become possible for those skilled in the art upon receiving the teachings of the present disclosure without departing from the scope thereof.

Figure 54:
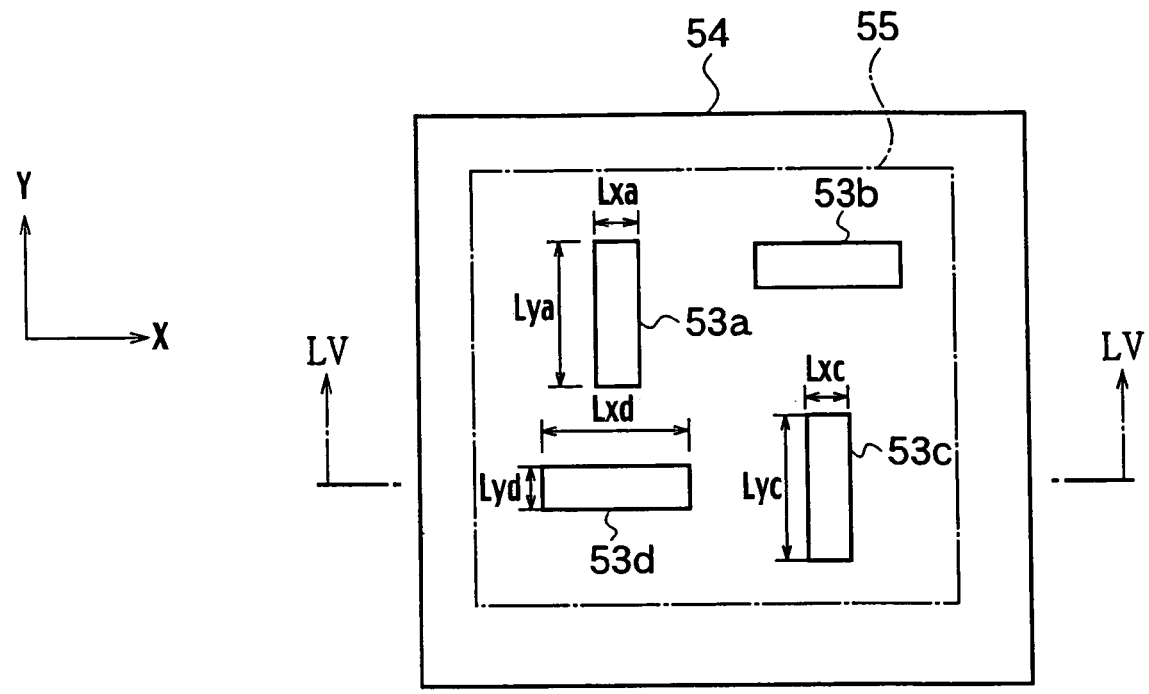
FIG. 54 is a plane view illustrating via arrangement example of the semiconductor device according to other embodiments of the present invention.
Figure 55:
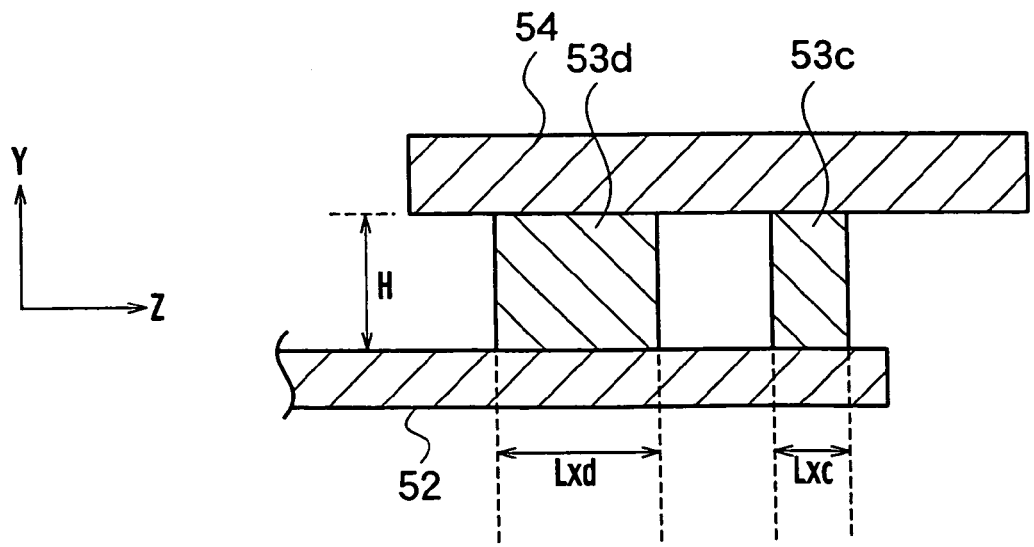
FIG. 55 is a cross-sectional view taken on line in LV—LV in FIG. 54.

In the aforementioned embodiment, the examples of the flat vias each having X-direction and Y-direction aspect ratios of not less than 1 are shown. However, flat vias with any one of the X-direction and Y-direction aspect ratios of not less than 1 can accomplish a certain object. For example, FIG. 54 shows an example of a positional relationship between the connecting pad 54 and the flat vias 53a to 53d which are arranged to be adjacent to each other under the connecting pad 54. FIG. 55 shows an example of a cross-section taken on a line LV—LV in FIG. 54. In FIG. 54, for explanation, the flat vias 53a to 53d under the connecting pad 54 are indicated by real lines.

In the flat via 53d, a length $Lx_d$ in the direction X is longer than a length $Ly_d$ in the direction Y. On the other hand, in the flat via 53a arranged adjacent to the flat via 53d, a length $Lx_a$ in the direction X is shorter than a length $Ly_a$ in the direction Y. Also in the flat via 53c arranged to be adjacent to the flat via 53d, the length $Lx_c$ in the direction X is shorter than the length $Ly_c$ in the direction Y. As shown in FIG. 55, the flat via 53d has an aspect ratio of the length $Lx_d$ to the height H of not less than 1 while the flat via 53c has an aspect ratio of the length $Lx_c$ to the height H of not more than 1. Not shown in FIG. 55, the flat via 53a has an aspect ratio of the length $Lx_a$ to the height H of not more than 1. In this manner, when the flat vias 53a to 53d with one of the X-direction and Y-direction aspect ratios of not less than 1 are properly combined and arranged as shown in FIG. 54, it is possible to provide a semiconductor device having a via structure which is less likely to be broken by stresses in the directions X and Y.

What is claimed is:

1. A semiconductor device comprising:
   a plurality of first level wires;
   a low-dielectric constant film disposed on the first level wires;
   a plurality of first flat vias embedded in the low-dielectric constant film and connected to the first level wires, each of the first flat vias being defined by at least four first side walls extending along a longitudinal direction of the first level wires and at least four second side walls extending along an orthogonal direction to the longitudinal direction on a plane where the first level wires are disposed, each of the first flat vias having a first length in the longitudinal direction and a second length in the orthogonal direction, wherein an aspect ratio of at least one of the first and second lengths to a height perpendicular to the plane where the first level wires are disposed is over 1; and
   a plurality of second level wires disposed in the low-dielectric constant film and connected to the first flat vias.

2. The semiconductor device of claim 1, wherein a relative permittivity of the low-dielectric constant film is below 3.0.

3. The semiconductor device of claim 1, wherein the low-dielectric constant film includes materials selected from the group consisting of methyl silsesquioxane polymer, hydrogen silsesquioxane polymer, porous hydrogen silsesquioxane polymer, porous methyl silsesquioxane polymer, organic silica, polytetrafluoroethylene, polyarylene ether, porous polyarylene ether, and benzocyclobutene.

4. The semiconductor device of claim 1, wherein the low-dielectric constant film is composed of a plurality of insulating films having different relative permittivities.

5. The semiconductor device of claim 1, further comprising a pad electrode disposed above the second level wires.

6. The semiconductor device of claim 1, wherein the first flat vias and the first and second level wires are made from copper.

7. The semiconductor device of claim 1, further comprising:
   a plurality of first level dummy wires disposed in a same layer as the first level wires and spaced from the first level wires;
   a plurality of second level dummy wires disposed in a same layer as the second level wires and spaced from the second level wires; and
   a plurality of second flat vias connected to the first and second level dummy wires respectively, each via having at least one length in a direction of the first and second lengths longer than the height.

8. The semiconductor device of claim 7, wherein the first and second level dummy wires and the second flat vias are made from copper.

9. The semiconductor device of claim 7, wherein at least one length in a direction of the first and second lengths of the first level dummy wires are below a tenth of a minimum interwire distance between the first level wires adjoining to each other.

10. The semiconductor device of claim 7, wherein a ratio of exposed part of the first level dummy wires to a surface plane where the first level wires are arranged is from 30 to 60%.

11. The semiconductor device of claim 1, further comprising:
   a dummy wiring section spaced from the first and second level wires, the dummy wiring section comprises:

a first level dummy wire disposed in the same layer as the first level wires;

a second level dummy wire disposed in the same layer as the second level wires;

a wire spaced from the second level dummy wire and electrically connected to the first and second level wires; and a second flat via connected to the first and second level dummy wires respectively, each via having at least one length in a direction of the first and second lengths longer than the height.

12. The semiconductor device of claim 1, wherein at least two first side walls and at least two second side walls establish an inner side wall of each of the first flat vias, and at least two first side walls and at least two second side walls establish an outer side wall of each of the first flat vias so as to implement a hollow space in each of the first flat vias.

13. The semiconductor device of claim 12, wherein the hollow space is surrounded by rectangular inner side walls implemented by two of the first side walls and two of the second side walls so that each of the first flat vias establishes a rectangular ring-shape.

14. The semiconductor device of claim 1, wherein each of the first flat vias in a cross sectional view cut perpendicular to the height direction of each of the first flat vias establishes a concave polygonal shape.

15. The semiconductor device of claim 1, wherein each of the first flat vias in a cross sectional view cut perpendicular to the height direction of each of the first flat vias establishes a cross shape.

16. The semiconductor device of claim 1, wherein each of the first flat vias in a cross sectional view cut perpendicular to the height direction of each of the first flat vias establishes a parallel crosses shape.

17. The semiconductor device of claim 1, wherein each of the first flat vias in a cross sectional view cut perpendicular to the height direction of each of the first flat vias establishes a meandering shape.

* * * * *